United States Patent [19]
Kurosawa

[11] Patent Number: 5,661,388
[45] Date of Patent: Aug. 26, 1997

[54] POSITIONING METHOD AND POSITIONING SYSTEM

[75] Inventor: Hiroshi Kurosawa, Tokyo, Japan

[73] Assignee: Canon Kabushiki Kaisha, Tokyo, Japan

[21] Appl. No.: 448,872

[22] Filed: May 24, 1995

[30]  Foreign Application Priority Data

May 24, 1994 [JP] Japan .................... 6-135224

[51] Int. Cl.⁶ .............. G05D 3/12; B65G 49/07; B23Q 16/00
[52] U.S. Cl. .............. 318/625; 318/593; 318/626; 318/685; 310/311
[58] Field of Search .............. 318/560, 575, 318/590, 592, 625, 626, 41, 85, 101, 102, 593, 685; 310/311

[56]  References Cited

U.S. PATENT DOCUMENTS

| | | |
|---|---|---|
| 3,997,828 | 12/1976 | Bottcher et al. . |
| 4,987,526 | 1/1991 | Slocum et al. . |
| 5,112,133 | 5/1992 | Kurosawa et al. . |
| 5,157,700 | 10/1992 | Kurosawa et al. . |
| 5,172,402 | 12/1992 | Mizusawa et al. . |
| 5,182,615 | 1/1993 | Kurosawa et al. . |
| 5,377,251 | 12/1994 | Mizusawa et al. . |

FOREIGN PATENT DOCUMENTS 3-282912  12/1991  Japan .

*Primary Examiner*—Bentsu Ro
*Attorney, Agent, or Firm*—Fitzpatrick, Cella, Harper & Scinto

[57]  ABSTRACT

A positioning method and positioning system wherein a driving device, for moving a movable table on a rough-motion stage by a small amount, is alternately controlled through a pair of switchable control systems. The amounts by which the table is driven are initially adjusted to the same amounts by the pair of control systems when the paired control systems are switched.

15 Claims, 24 Drawing Sheets

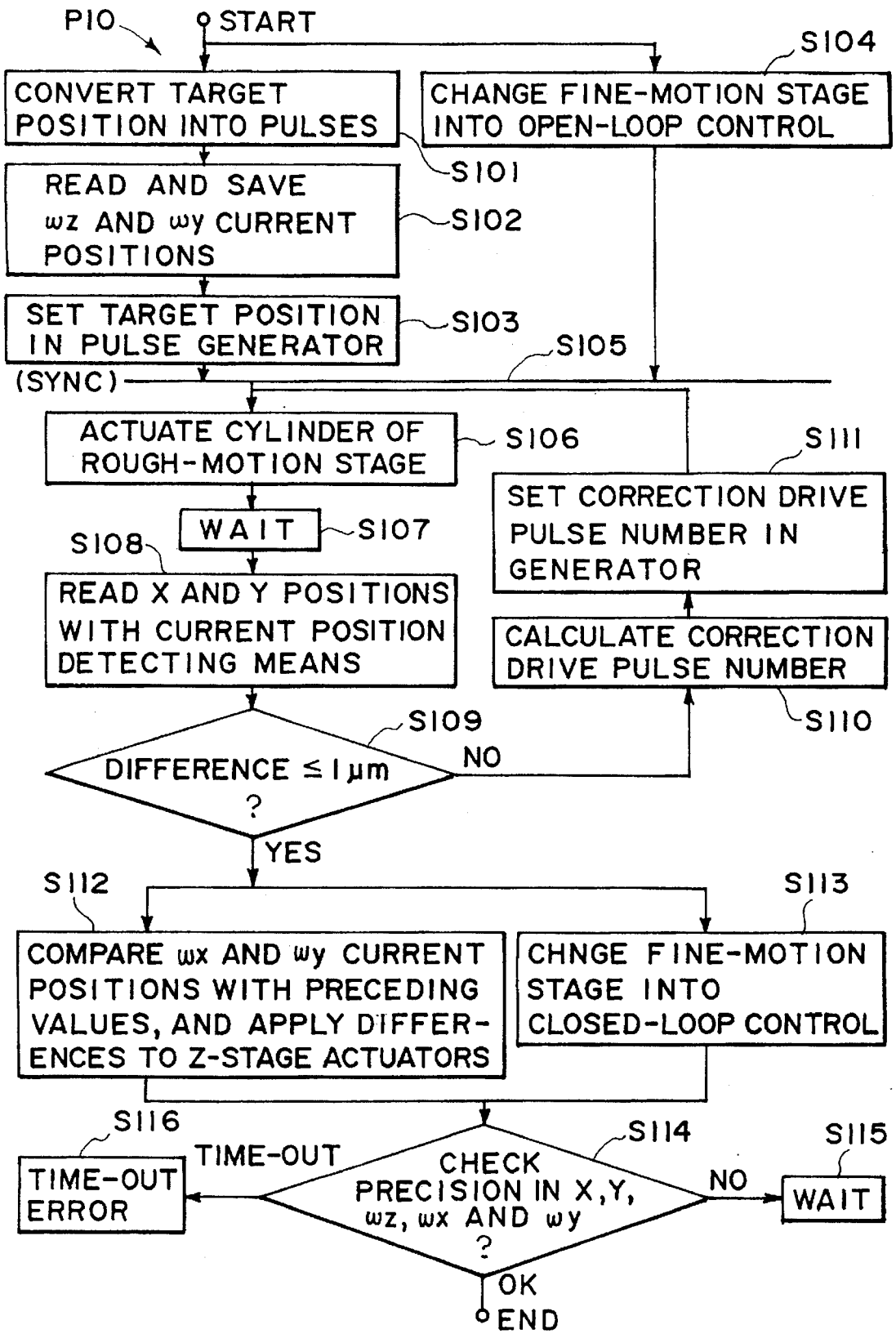
F I G. 11

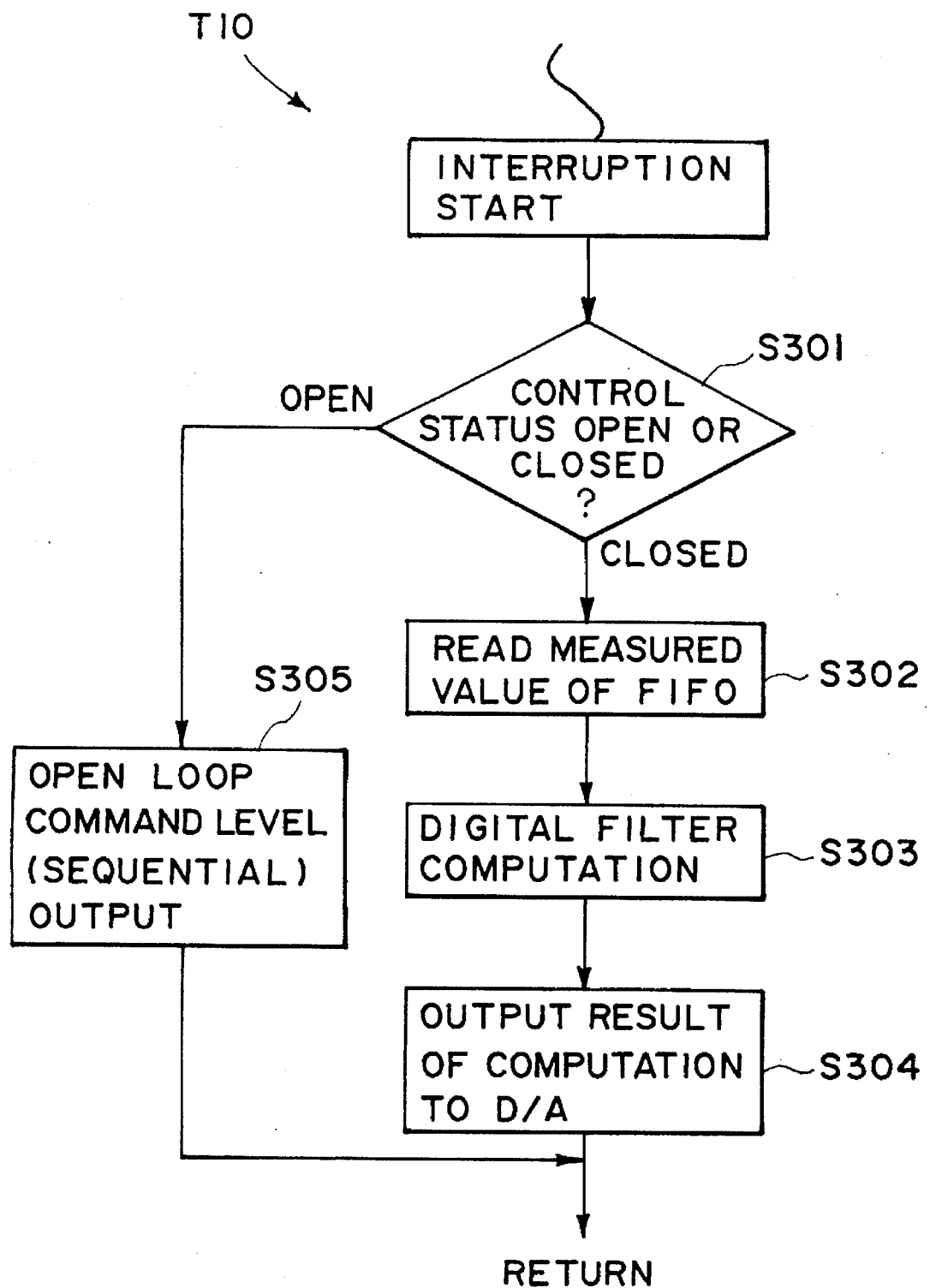
F I G. 15

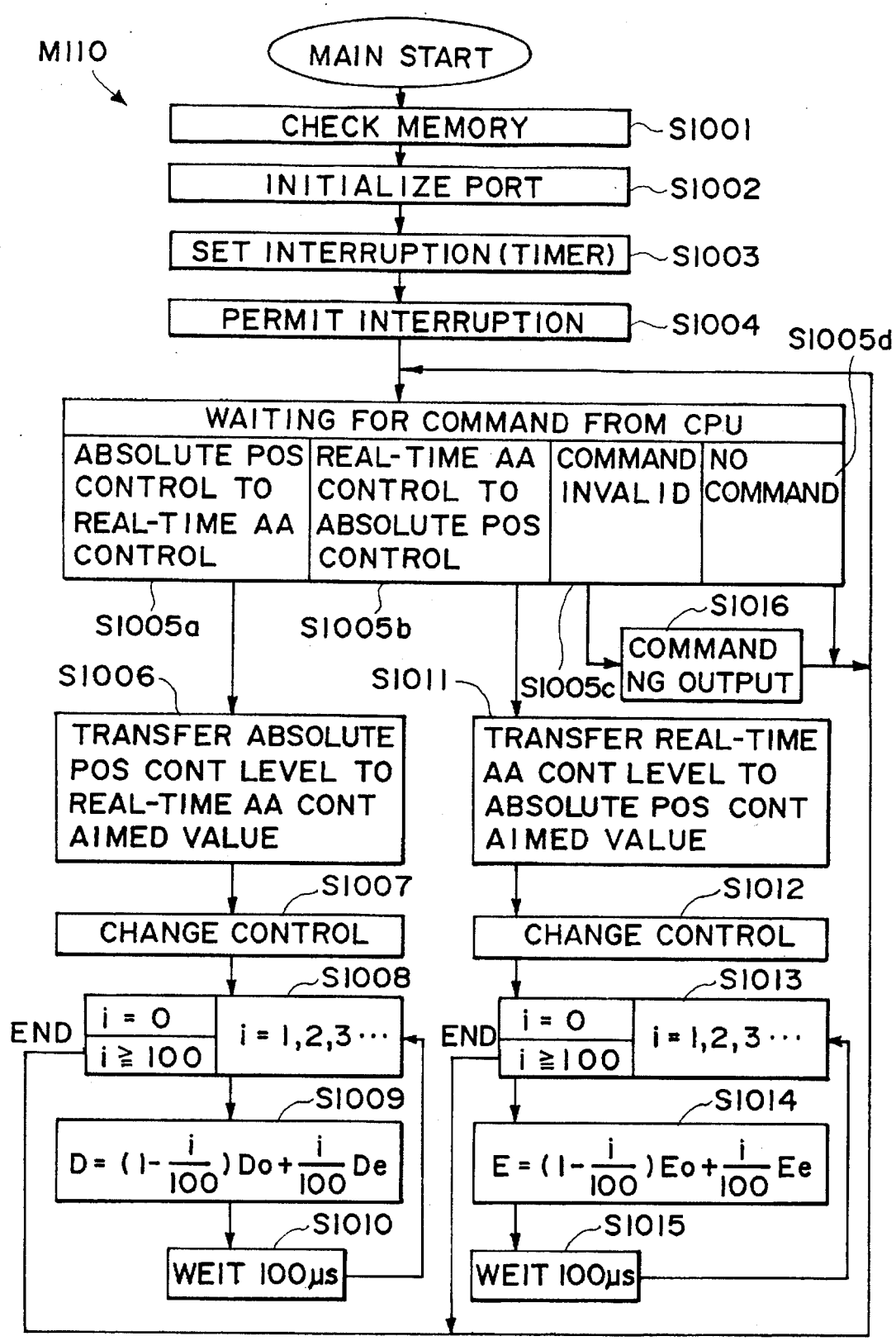
F I G. 20

POSITIONING METHOD AND POSITIONING SYSTEM

FIELD OF THE INVENTION AND RELATED ART

This invention relates to a positioning method and positioning system usable in an exposure apparatus, for positioning a substrate such as a wafer with respect to exposure light. According to another aspect, the invention is concerned with an exposure apparatus which uses such a positioning method or a positioning system.

With recent increases in the density of semiconductor devices, exposure apparatuses for transferring and printing fine patterns are required to have higher and higher transfer and printing precision. For improving the transfer and printing precision of an exposure apparatus, the precision of a positioning system for positioning a substrate, such as a wafer, with respect to exposure light should first be increased. Also, for decreasing the manufacturing cost of semiconductor devices, enlargement in the size of a wafer is desirable to allow mass-production. To this end, the positioning system should have a long stroke. Moreover, a higher positioning speed and improved durability of the system are also desired.

Japanese Laid-Open Patent Application, Laid-Open No. 282912/1991 shows a positioning system of a separated rough-motion and fine-motion type, having a rough-motion stage mechanism for stepwisely moving, at a high speed, a movable table onto which a substrate, such as a wafer, is attracted, and a fine-motion stage mechanism for detecting the current position of the movable table through a laser interferometer and for positioning the movable table with a high precision on the basis of the difference between the current position and the target position (destination).

FIG. 24 is a schematic view for explaining the concept of such a separated rough-motion and fine-motion positioning system. It comprises a rough-motion stage $C_3$ being frictionally driven in a predetermined direction by a friction roller $C_2$ which is rotated by a servo motor $C_1$, and a fine-motion stage $F_3$ supported on the rough-motion stage $C_3$ by leaf springs $F_1$ and being driven by small amount in a direction by means of a piezoelectric device $F_2$. The amount of drive of the servo motor $C_1$ is controlled by means of a rough-motion stage driving circuit of a computer, not shown. The amount of drive of the piezoelectric device $F_2$ is maintained at a constant level through a command from the computer, during the stepwise motion of the rough-motion stage $C_3$. After completion of the stepwise motion of the rough-motion stage $C_3$, the drive is controlled on the basis of the difference between a target position as memorized in the computer and the output of a laser interferometer $F_5$, which receives reflected light from a mirror $F_4$ being integral with the fine-motion stage $F_3$.

FIG. 25 is a block diagram for explaining a driving circuit for the piezoelectric device $F_2$. It comprises: an open loop command line $L_1$ for applying an open loop command value, signaled from the computer, to one contact point $T_1$ of an input switch $S_1$; a closed loop command line $L_2$ for applying a closed loop command value, signaled from the computer, to a differentiator $S_2$; a digital-to-analog (D/A) converter $S_3$ connected to the input switch $S_1$; an open loop drive line $L_3$ for directly applying an output voltage of the D/A converter $S_3$ to one contact point $T_3$ of an output switch $S_4$; and a closed loop drive line $L_4$ for applying an output voltage of the D/A converter $S_3$ to the other contact point $T_4$ of the output switch $S_4$ via an integrator $S_5$ and a filter $S_6$. The differentiator $S_2$ serves to calculate the difference between the output of the laser interferometer $F_5$ and the closed loop command value of the computer, and it applies the calculated difference to the other contact point $T_2$ of the input switch $S_1$.

The output switch $S_4$ is connected to the piezoelectric device $F_2$ through an amplifier $S_7$. The voltage applied to the piezoelectric device $F_2$ by way of the contact points $T_3$ and $T_4$ of the output switch $S_4$, causes expansion or contraction of the piezoelectric device $F_2$, to thereby move the fine-motion stage $F_3$. The switching operation of the output switch $S_4$ is carried out in synchronism with the switching operation of the input switch $S_1$. As the D/A converter $S_3$ is connected to the contact point $T_1$ at the open loop command line $L_1$ side, the output voltage of the open loop drive line $L_3$ energizes the piezoelectric device $F_2$. On the other hand, the D/A converter $S_3$ is connected to the contact point $T_2$ at the differentiator $S_2$ side, the output voltage of the closed loop drive line $L_4$ energizes the piezoelectric device $F_2$.

As described above, the rough-motion stage driving circuit performs approximate positioning of the substrate (wafer) on the fine-motion stage $F_3$ at a high speed, by stepwisely moving the rough-motion stage $C_3$ through the servo motor $C_1$. During this positioning, the drive voltage of the piezoelectric device $F_2$ is maintained at the output voltage of the D/A converter $S_3$ which is based on the output level of the open loop drive line $L_3$, namely, the open loop command value. When the fine-motion stage $F_3$ comes to a position which is within the range of a predetermined tolerance to the target position, the input switch $S_1$ and the output switch $S_4$ are switched and, after this, the drive voltage of the piezoelectric device $F_2$ is controlled at the output voltage of the D/A converter $S_3$ which is based on the difference between the output of the laser interferometer $F_5$ and the output of the closed loop drive line $L_4$, i.e., the closed loop command value, to thereby move the fine-motion stage $F_3$ to the target position.

After the positioning of the fine-motion stage through the piezoelectric device is completed and thus the wafer on the fine-motion stage is going to be exposed, a positional deviation between the wafer and a mask is detected through an alignment optical system (not shown in the drawing). On the basis of the detection, the fine-motion stage is driven. This is called real-time autoalignment (AA) control. In this real-time autoalignment, the switching operation of the switches as described above, is necessary.

SUMMARY OF THE INVENTION

In the structure described above, the drive voltage of the piezoelectric device changes suddenly in response to the switching operation of the switches. This undesirably reduces the lifetime of the piezoelectric device and, additionally, it may lead to degradation of the connection between the movable table and the rough-motion stage or the piezoelectric device, which may cause a decrease in positioning precision or fatigue failure.

When the piezoelectric device for driving the fine-motion stage is replaced by a fine-motion driving device comprising a known pulse motor, for example, similar to the case of piezoelectric device, a sudden change of the driving force in response to the switching operation may cause a decrease in the life of the pulse motor and a decrease in the positioning precision.

It is accordingly an object of the present invention to provide a positioning method or a positioning system, or an exposure apparatus using the same, by which, when a control system of driving means such as a piezoelectric device, for moving a movable table on a rough-motion stage is switched, a sudden change of the drive force in the driving means is avoided.

In accordance with an aspect of the present invention, there is provided a positioning method in which driving means, for moving, by a small amount, a movable table on a rough-motion stage is controlled alternately through a pair of changeable control systems and in which, when the pair of changeable control systems are changed, controlled variables or control amounts of them are temporally made equal to each other.

Before changing the control systems, the control amount of one control system may be applied to the other control system.

A sequence may be adopted so that, after the control systems are changed, the control amount of one control system is changed successively to a predetermined amount by regular amounts or at a predetermined ratio.

In accordance with another aspect of the present invention, there is provided a positioning system which comprises driving means for moving, by a small amount, a movable table on a rough-motion stage, a pair of changeable control systems for alternately controlling the driving means, and branching means for applying a controlled variant or control amount of one of the control systems to the other.

As the control systems are changed, the control amounts of them are of the same level and, therefore, the driving force of the driving means do not change uninterruptedly. Since the output of one of the control systems changes smoothly after the control systems are changed, sudden change of the driving force of the driving means is effectively avoided. As a result, an unwanted decrease in the life of the driving means, which otherwise might be caused by the switching, is prevented. Additionally, a decrease in positioning precision or fatigue failure, attributable to degradation of the connection between the driving means and the movable table, for example, is avoided. Thus, a positioning system of high precision and good durability is ensured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 11 is a chart for explaining the positioning sequence according to the first embodiment.

FIG. 15 is a chart for explaining a first timer interruption sequence in the local bus main sequence of FIG. 13.

FIG. 20 is a chart for explaining a driving system changing sequence according to the second embodiment.

DESCRIPTION OF THE PREFERRED EMBODIMENTS

Figure 1:
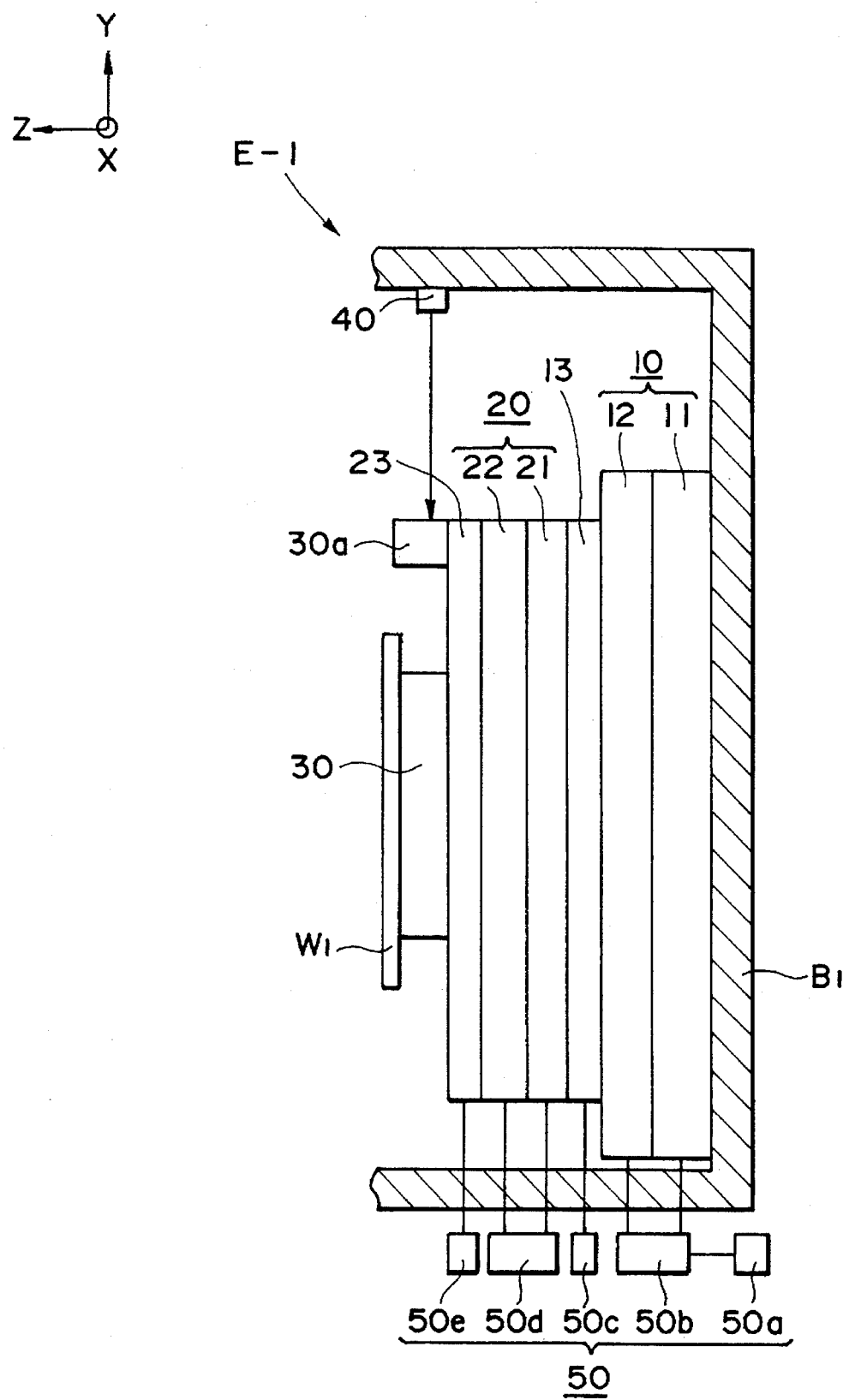
FIG. 1 is a schematic view for explaining a general structure of a positioning system according to a first embodiment of the present invention.

FIG. 1 illustrates a general structure of a positioning system E-1 to be used in an exposure apparatus, according to a first embodiment of the present invention. It comprises: a rough-motion stage mechanism (rough-motion stage) 10 having a Y-axis rough-motion stage 11 supported by a base table $B_1$ and an X-axis rough-motion stage 12 supported by the Y-axis rough-motion stage 11, a Z-axis tilt stage 13 supported by the X-axis rough-motion stage 12, a Y-axis fine-motion stage 21 and an X-axis fine-motion stage 22 (these being movable tables), and a fine-rotation stage 23. The Y-axis fine-motion stage 21 and the X-axis fine-motion stage 22 constitute a fine-motion stage mechanism 20. The fine-rotation stage 23 supports a wafer chuck 30 for attracting a wafer $W_1$. The position of the wafer chuck 30 can be detected by a current position detecting device 40 which comprises a plurality of laser interferometers for receiving reflected light from an L-shaped mirror, being integral with the wafer chuck.

At the left-hand side of the wafer chuck 30 as viewed in the drawing, there is an exposure optical system (not shown), having exposure means of a known structure, for transferring a fine pattern onto the wafer $W_1$.

The rough-motion stage mechanism 10 serves to stepwisely move the wafer $W_1$ in the directions of two orthogonal axes (hereinafter, the X axis and the Y axis) by use of the Y-axis rough-motion stage 11 and the X-axis rough-motion stage 12, to thereby perform approximate positioning of the same. The Z-axis tilt stage 13 serves to move the wafer $W_1$ along an axis (hereinafter, the Z axis) which is perpendicular to the aforementioned two axes, and also to adjust the tilt angles wx and wy with respect to the Z axis to thereby adjust the perpendicularity of the wafer $W_1$ with respect to the exposure light. The Y-axis fine-motion stage 21 and the X-axis fine-motion stage 22 of the fine-motion stage mechanism 21 are driven by a small amount in the Y-axis direction and in the X-axis direction, respectively. After the approximate positioning of the wafer $W_1$ through the rough-motion stage mechanism 10 is completed, these fine-motion stages are driven on the basis of a difference between a target position (destination) as memorized in a main computer 50a of a controller 50 and the position of the wafer $W_1$ with respect to the X-axis direction and the Y-axis direction as detected by the current position detecting device 40 (hereinafter, the position will be referred to as the "X current position" or the "Y current position"), in a manner to be described later. The fine-rotation stage 23 is controlled on the basis of a rotational angle of the wafer $W_1$ about the Z axis as measured by the current position detecting device 40 (hereinafter, this angle will be referred to as the "wz current position").

While details will be described later, the rough-motion stage mechanism 10 is driven by a Y electric cylinder 14 and an X electric cylinder 15. The Z-axis tilt stage 13, the fine-motion stage mechanism 20 and the fine-rotation stage 23 are driven minutely by means of Z actuators 132a–132c (FIG. 7) (each comprising a piezoelectric device), a Y piezoelectric device 210, an X piezoelectric device 310 and a wz piezoelectric device 410 (FIG. 9) (each being driving means), respectively. These power cylinders and piezoelectric devices are controlled by a rough-motion stage driving circuit 50b of the controller 50 having the main computer 50a, as well as a Z-axis tilt stage driving circuit 50c, a fine-motion stage mechanism driving circuit 50d and a fine-rotation stage driving circuit 50e, respectively.

Figure 2:
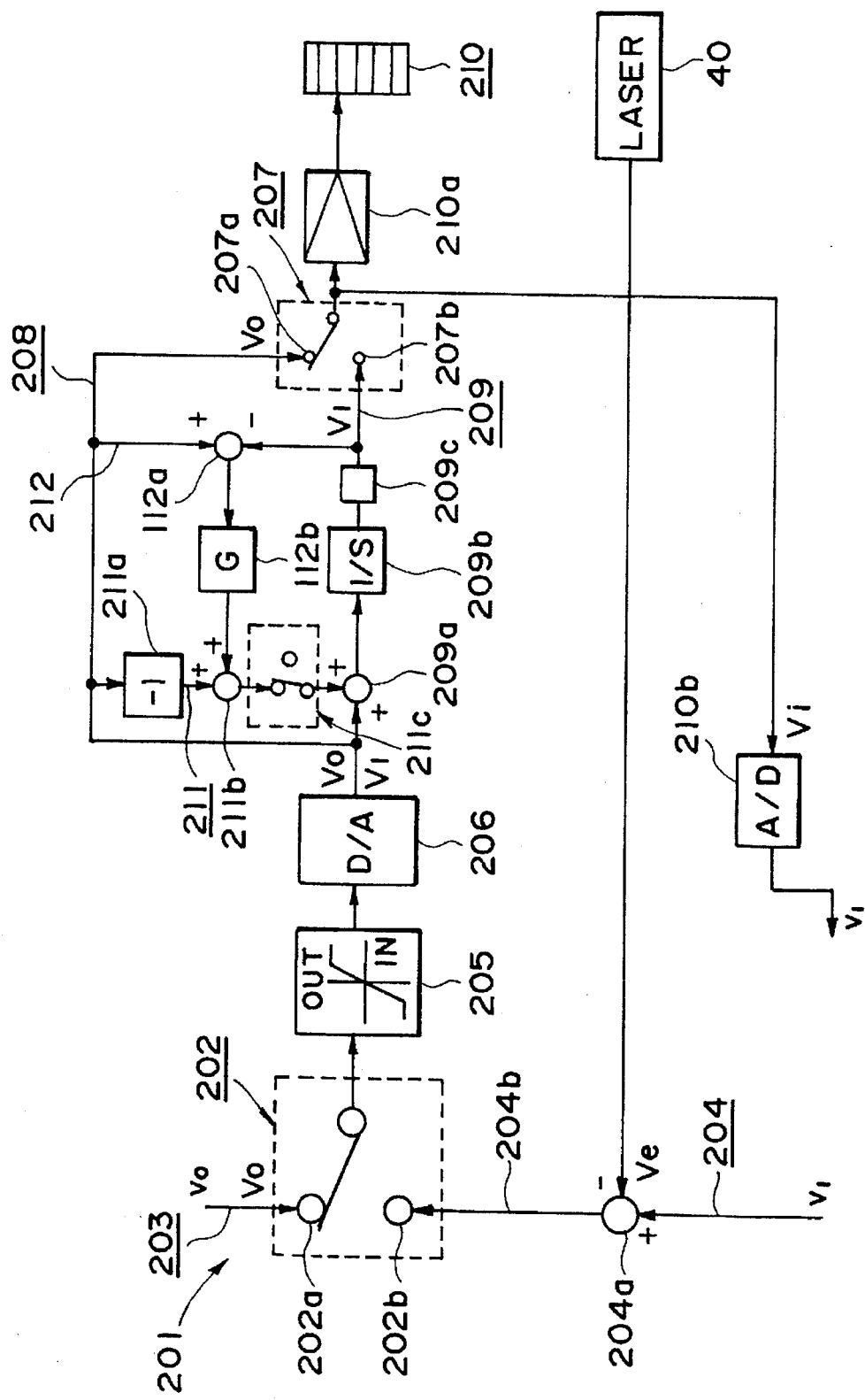
FIG. 2 is a block diagram for explaining a piezoelectric device driving circuit for a Y piezoelectric device of a Y-axis fine-motion stage of the first embodiment.

FIG. 2 illustrates a piezoelectric device driving circuit 201 of the Y piezoelectric device 210 for driving the Y-axis fine-motion stage 21 of the fine-motion stage mechanism 20. The piezoelectric device driving circuit 210 comprises: an open loop command line 203 for applying an open loop command valve $v_0$ (command) as signaled from the main computer 50a to one contact point 202a of an input switch 202; a differentiator 204a for calculating the difference between the output $v_e$ (Y current position) of the current position detecting device 40 and an open loop command value $v_1$ (target position) as signaled from the main computer 50a via an open loop command line 204; a differential value applying line 204b for connecting the differentiator with the other contact point 202b of the input switch 202; a D/A converter 206 connected to the input switch 202 through a bit slicer 205; an open loop drive line 208 which is a control system for directly applying the output voltage of the D/A converter 206 to one contact point 207a of an output switch 207; and a closed loop drive line 209 which is a control system for applying the output voltage of the D/A converter 206 to the other contact point 207b of the output switch 207 via a closed loop adder 209a, an integrator 209b (such as an analog integrator) and a filter 209c (such as a serve compensation filter). The output switch 207 is connected to the Y piezoelectric device 210 via an amplifier 210a, and the Y piezoelectric device 210 is expanded or contracted in response to a drive voltage as applied thereto via the contact point 207a or 207b of the output switch 207.

The bit slicer 205 has the function of saturating a voltage of a pulse number not less than +32767 pulses, into +32767 pulses, and also for saturating a voltage of a pulse number not greater that −32768 pulses, into −32768 pulses. This is to avoid application of an excessive differential signal to the D/A converter 206. The switching operation of the output switch 207 and the switching operation of the input switch 292 are performed in a timed relation. As the D/A converter 206 is connected to the contact point 202a at the open loop command line 203 side, the output voltage $V_0$ of the D/A converter 206 (which is the controlled variant based on the open loop command value $v_0$) is applied to the Y piezoelectric device 210 via the open loop drive line 208 to thereby drive this piezoelectric device. On the other hand, when the D/A converter 206 is connected to the contact point 202b at the closed loop command line 204 side, the output of the D/A converter 206 (which is the controlled variant based on the difference between the output $v_e$ of the current position detecting device 40 and the closed loop command value $v_1$) is applied to the Y piezoelectric device 210 via the closed loop drive line 209.

The open loop drive line 208 comprises (i) a first branch line 211 for applying the output voltage $V_0$ thereof to the closed loop drive line 209 via an inversion amplifier 211a, an open loop adder 211b and an opening/closing switch 211c, and (ii) a second branch line 212 for comparing the output voltage $V_0$ of the open loop drive line 208 with the output voltage $V_1$ of the closed loop drive line 209, within the comparator 112a, and for applying a differential value to the open loop adder 211b via an amplifier 112b. These lines are so controlled that: the voltage applied from the D/A converter 206 to the closed loop drive line 209 is once canceled by a voltage of opposite polarity as applied from the open loop drive line 208 through the first branch line 211, and then the output voltage $V_0$ of the open loop drive line 208 is applied to the closed loop drive line 209 through the second branch line, such that the voltage at the contact point 207b of the output switch 207, at the closed loop drive line 209 side, becomes equal to the voltage at the contact point 207a at the open loop drive line 208 side (that is, the output voltage $V_0$ of the open loop drive line 208).

During the stepwise motion of the wafer $W_1$ by the rough-motion stage mechanism 10, the opening/closing switch 211c is held closed while the input switch 202 and the output switch 207 are connected to the contact points 202a and 207a at the open loop drive line 208 side, respectively, such that the output voltage $V_0$ based on the open loop command value $v_0$ is applied to the Y piezoelectric device 210. This state will hereinafter be referred to as the "open loop controlled state". After the stepwise motion of the wafer $W_1$ is completed, the opening/closing switch 211c is opened, and the input switch 202 and the output switch 207 are switched to the contact points 202b and 207b at the closed loop drive line 209 side, respectively. Thus, the difference between the output $v_e$ (Y current position) of the current position detecting device 40 and the closed loop command value $v_1$ as applied from the closed loop command line 204, is calculated by the differentiator 204a, and the output voltage $V_1$ based on the thus calculated differential value is applied to the Y piezoelectric device 210. The final positioning is thus performed. This state will hereinafter be referred to as the "closed loop controlled state".

When the open loop controlled state is to be switched to the closed loop controlled state, even if there is a difference between the open loop command value $v_0$ and the output of the differentiator 204a, since the contact point 207a at the closed loop drive line 209 side, having been under the open loop controlled state, is kept at the same voltage as the contact point 207a at the open loop drive line 208, the drive voltage of the piezoelectric device 210 does not change interruptedly by the switching. It changes gradually with a gentle slant due to a response delay of the integrator 209a, for example, of the closed loop drive line 209.

Also, when the closed loop controlled state is to be switched to the open loop controlled state, if there is a difference between the output of the differentiator 204a and the open loop command value $v_0$, there is a possibility that the drive voltage of the Y piezoelectric device 210 changes interruptedly to cause a reduction of the life of the Y piezoelectric device 210 or degradation of the connection between the Y-axis fine-motion stage 21 and the X-axis fine-motion stage 22. In consideration thereof, the main computer 50a is provided with a command value changing sequence R10. This command value changing sequence is a sequence such that: a value $v_i$ obtained by reading the drive voltage $V_i$ of the Y piezoelectric device 210 just before the switching operation and by A/D converting the read value through the A/D converter 210b is transferred to the main computer 50a; the magnitude of the open loop command value $v_0$ is then set to be equal to the transferred value $v_i$, such that the output voltage of the open loop drive line 208 becomes equal to the output voltage of the closed loop drive line 209; then the input switch 202 and the output switch 207 are switched; and after this, the magnitude of the open loop command value $v_0$ is gradually changed to the target value $v_{0e}$ which is a predetermined value having been registered in the main computer 50a.

Figure 3:
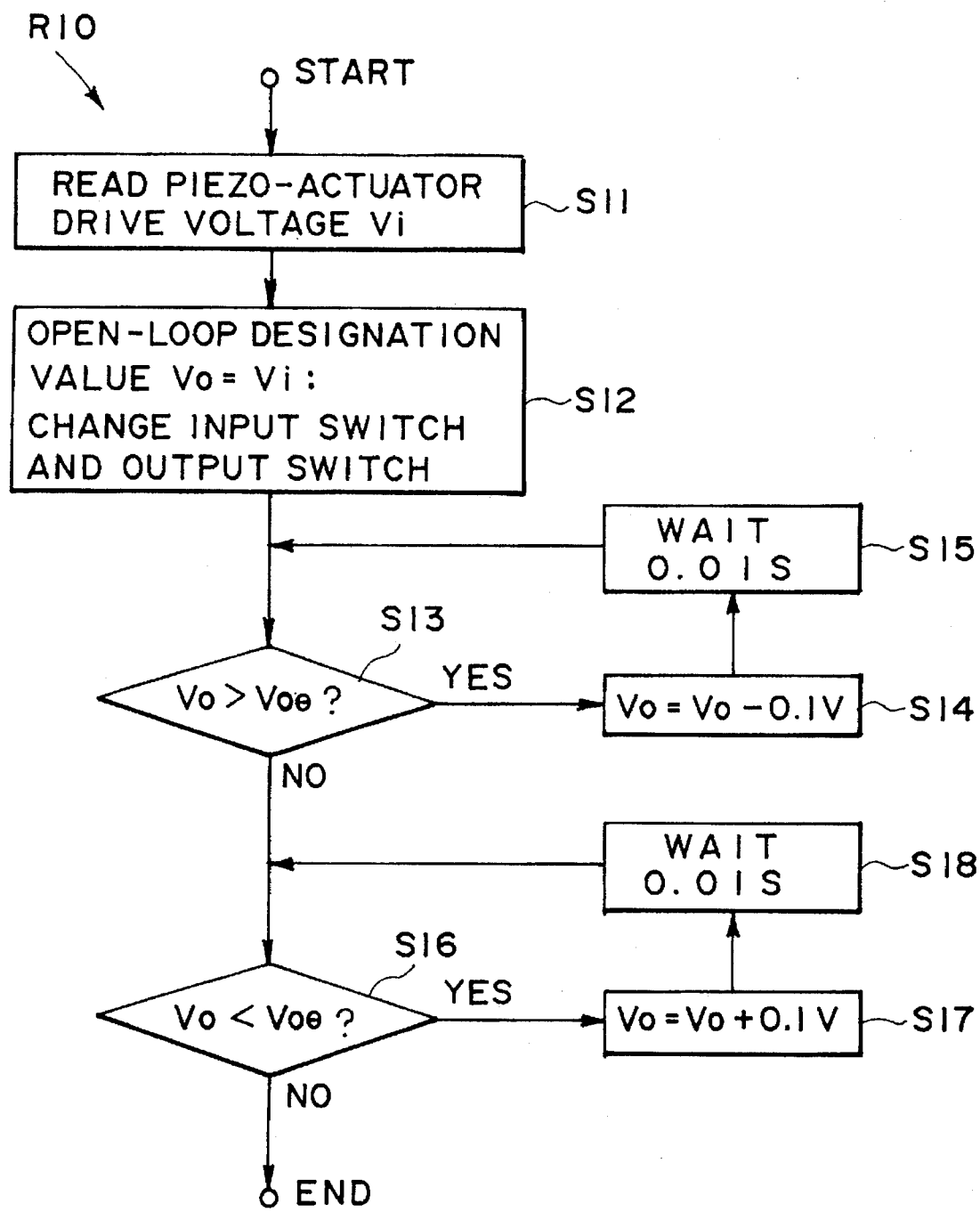
FIG. 3 is a chart of a command change sequence, for explaining the process of changing an open loop command value in the first embodiment.

The command value changing sequence R10 is performed as follows. Referring to FIG. 3, at step S11, the drive voltage $v_i$ of the Y piezoelectric device 210 is read through the A/C converter 210b, and a value $v_i$ obtained by A/D conversion of the read value is transferred to the open loop command value $v_0$. Then, the input switch 202 and the output switch 207 are changed. At step S13, the open loop command value $v_0$ and the target value $v_{0e}$ are compared with each other. If $v_0 > v_{0e}$, at step S14 the open loop command value $v_0$ is reduced by a predetermined amount (e.g. 0.1 volt). After a predetermined wait (e.g. 0.01 sec.) at step S15, the sequence goes back to step S13. If not $v_0 > v_{0e}$ at step S13, then at step S16 the open loop command value $v_0$ is compared with the target value $v_{0e}$ and, if $v_0 < v_{0e}$, at step S17 the open loop command value $v_0$ is increased by a predetermined amount (e.g. 0.1 volt). After a predetermined wait (e.g. 0.01 sec.) at step S18, the sequence goes back to step S16. It $v_0 < v_{0e}$ at step S16, $v_0 = v_{0e}$ and thus the command value changing sequence R10 finishes. With the provision of the command value changing sequence as described above, the drive voltage of the Y piezoelectric device 210 changes slowly when the closed loop controlled state is switched to the open loop controlled state.

Figure 4:
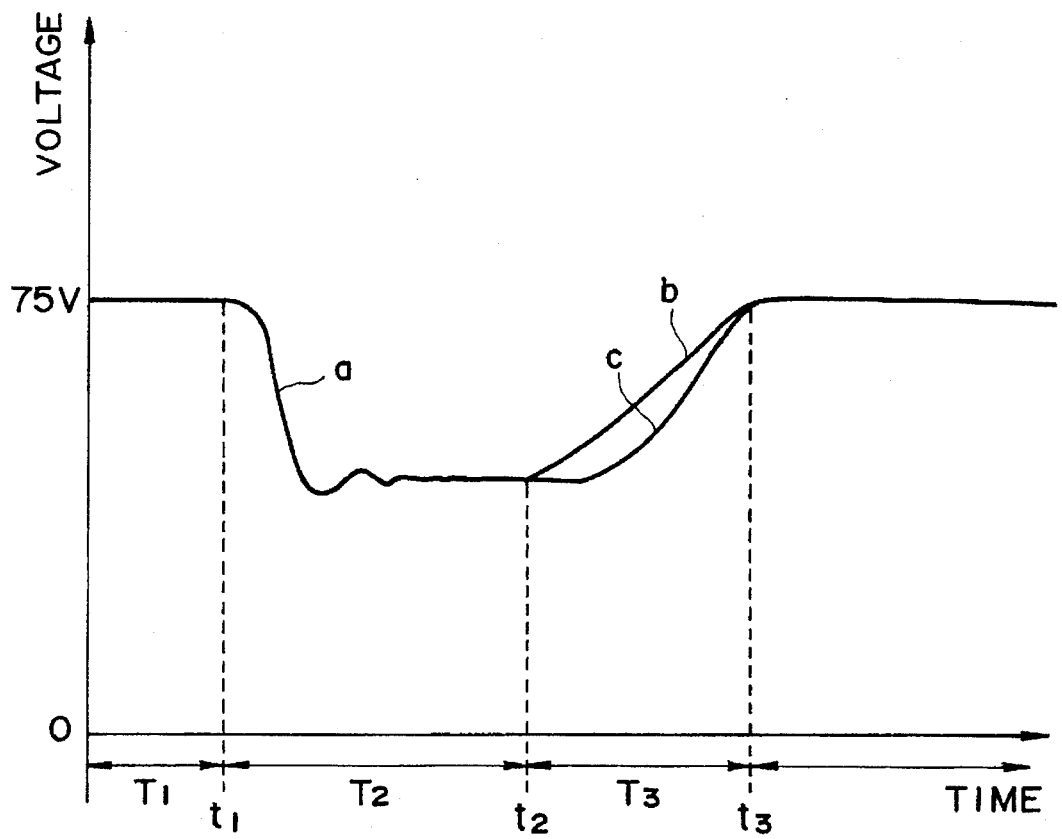
FIG. 4 is a graph, showing changes in the drive voltage of a Y piezoelectric device of the first embodiment.

FIG. 4 is a graph of changes of the voltage of the Y piezoelectric device 210 as the piezoelectric device driving circuit 201 is switched from the open loop controlled state to the closed loop controlled state and then is switched again back to the open loop controlled state. The piezoelectric device driving circuit 201 is in the open loop controlled state during the time period $T_1$ from time 0 to time $t_1$; it is in the closed loop controlled state during the time period $T_2$ from time $t_1$ to time $t_2$; it is in the process of the command value changing sequence R10 during the time period $T_3$ from time $t_2$ to time $t_3$; and it is in the open loop controlled state for the stepwise motion through the rough-motion state mechanism 10, after time $t_3$. In the open loop controlled state during the time period $T_1$ from time 0 to time $t_1$, the drive voltage based on the open loop command value $v_0$ is applied to the Y piezoelectric device 210 as described hereinbefore, and its voltage is maintained constant at 75 V. When at time $t_1$ the open loop controlled state is switched to the closed loop controlled state, since the contact points 207a and 207b of the output switch 207 are held at the same voltage as described, the drive voltage of the Y piezoelectric device 210 does not change interruptedly. It changes slowly along a curve "a" due to a response delay of the closed loop drive line 209, for example. Also, when the closed loop controlled state is switched to the open loop controlled state, since the open loop drive line 208 is controlled in accordance with the command value changing sequence R10, the drive voltage of the Y piezoelectric device 210 changes uninterruptedly along a gentle curve "b". The shape of the curve "b" is determined in accordance with the amount of increase/decrease of the open loop command value $v_0$ and the wait time in the command value changing sequence R10. By changing them with time so that the initial portion and the end portion of the time period $T_3$ of the command value changing sequence R10 have a very small slant as depicted by a curve "c", the impact or the like to be applied to the Y piezoelectric device 210 or the positioning system as a whole can be reduced considerably.

The X piezoelectric device 310 for driving the X fine-motion stage 22 and the wz piezoelectric device 410 (FIG. 9) for driving the fine-rotation stage 23 each is controlled by a piezoelectric device driving circuit similar to the piezoelectric device driving circuit 201. Also, the switching from the closed loop controlled state to the open loop controlled state is performed in the opposite way to the described.

Next, the structure of the rough-motion stage mechanism 10, the Z-axis tilt state 13, the fine-motion stage mechanism 20, the fine-rotation stage 23 and the controller 50, will be describe in detail.

Figure 5:
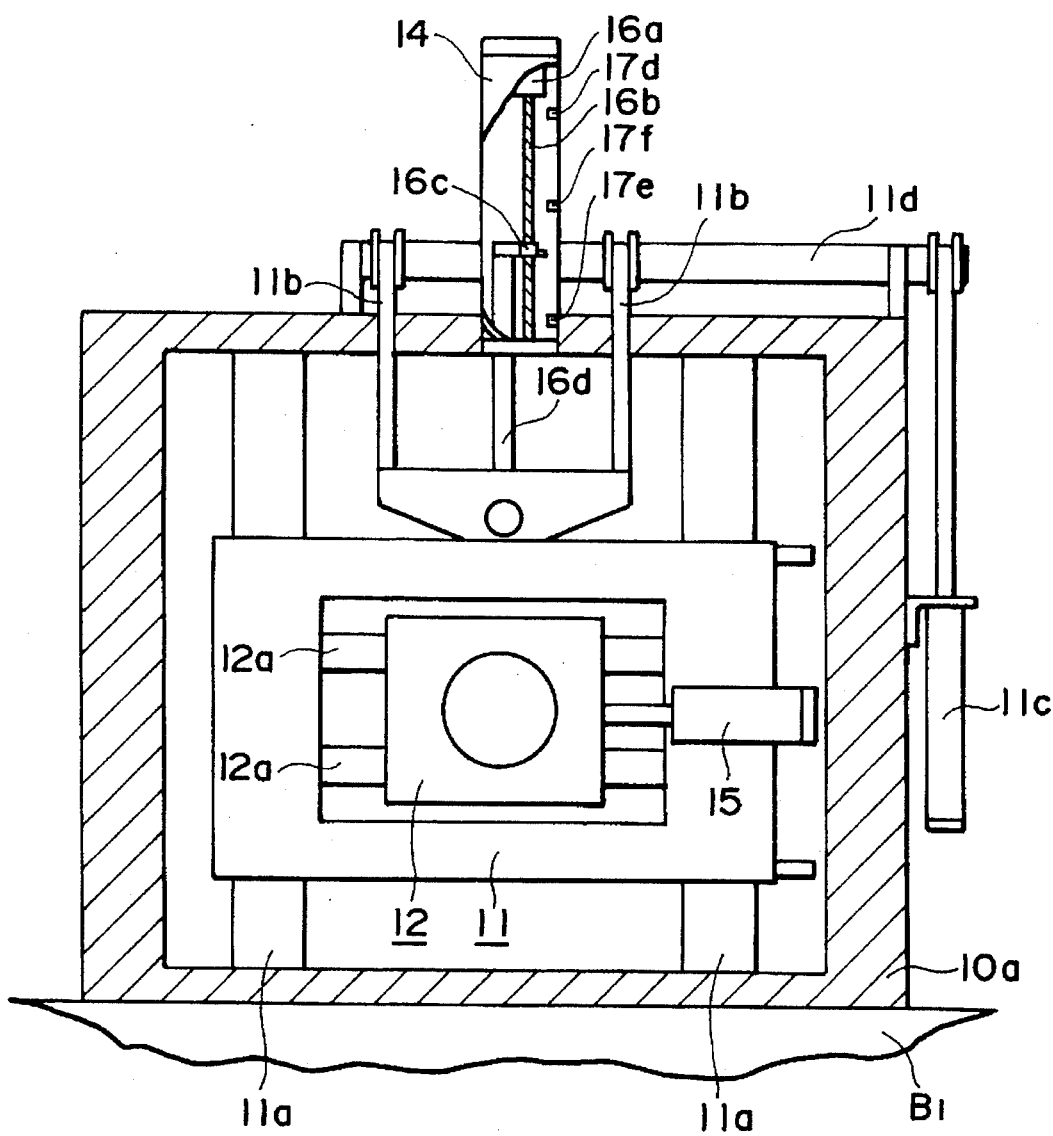
FIG. 5 is a schematic view of a rough-motion stage mechanism of the first embodiment.

FIG. 5 is a schematic and sectional view of the rough-motion stage mechanism 10. The Y-axis rough-motion stage 11 as described is reciprocally movable through the Y power cylinder 14 in a perpendicular direction along a pair of Y guides 11a which are integral with a base table 10a fixedly mounted on a floor $B_1$. The X-axis rough-motion stage 12 is reciprocally movable through the X power cylinder 15 in a horizontal direction along a pair of X guides 12a which are integral with the Y-axis rough-motion stage 11. Each of the Y power cylinder 14 and the X power cylinder 15 comprises a servo motor 16a, a feed screw 16b rotated by the servo motor, and a feed rod 16d which is integral with a nut 16c engaging with the feed screw. Rotation of the feed screw 16b causes reciprocal motion of the feed rod 16d, by which the Y-axis rough-motion stage 11 or the X-axis rough-motion stage 12 is reciprocally moved. The Y-axis rough-motion stage 11 is suspended by a pair of balancer belts 11b for cancelling the gravity. The tension force of these balancer belts 11b is controlled by a torque applied to a rotational shaft 11d from a balancer cylinder 11c.

Figure 6:
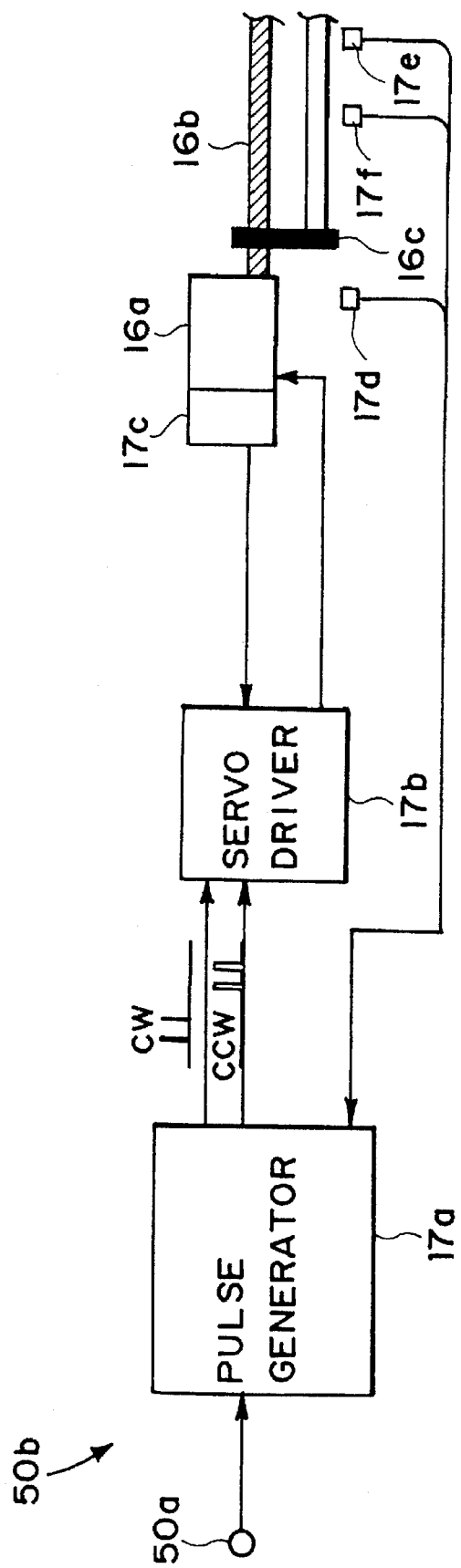
FIG. 6 is a diagram for explaining a rough-motion stage driving circuit of the first embodiment.

FIG. 6 illustrates the rough-motion stage driving circuit 50b. It comprises a pulse generator 17a connected to the main computer 50a, and a servo driver 17b which is driven by driving pulses from the pulse generator. The output of the servo driver 17b is applied to a servo motor 16a via an encoder 17c to drive the servo motor, and to move the nut 16c along the feed screw 16b. Stroke limit sensors 17d and 17e are provided at the opposite ends of the movement path of the nut 16c, and an origin sensor 17f is disposed between these limit sensors. On the basis of the outputs of theses sensors, the presence of the Y-axis rough-motion stage 11 or the X-axis rough-motion stage 12 at an end position or a middle position in its predetermined movement path, can be detected.

Figure 7:
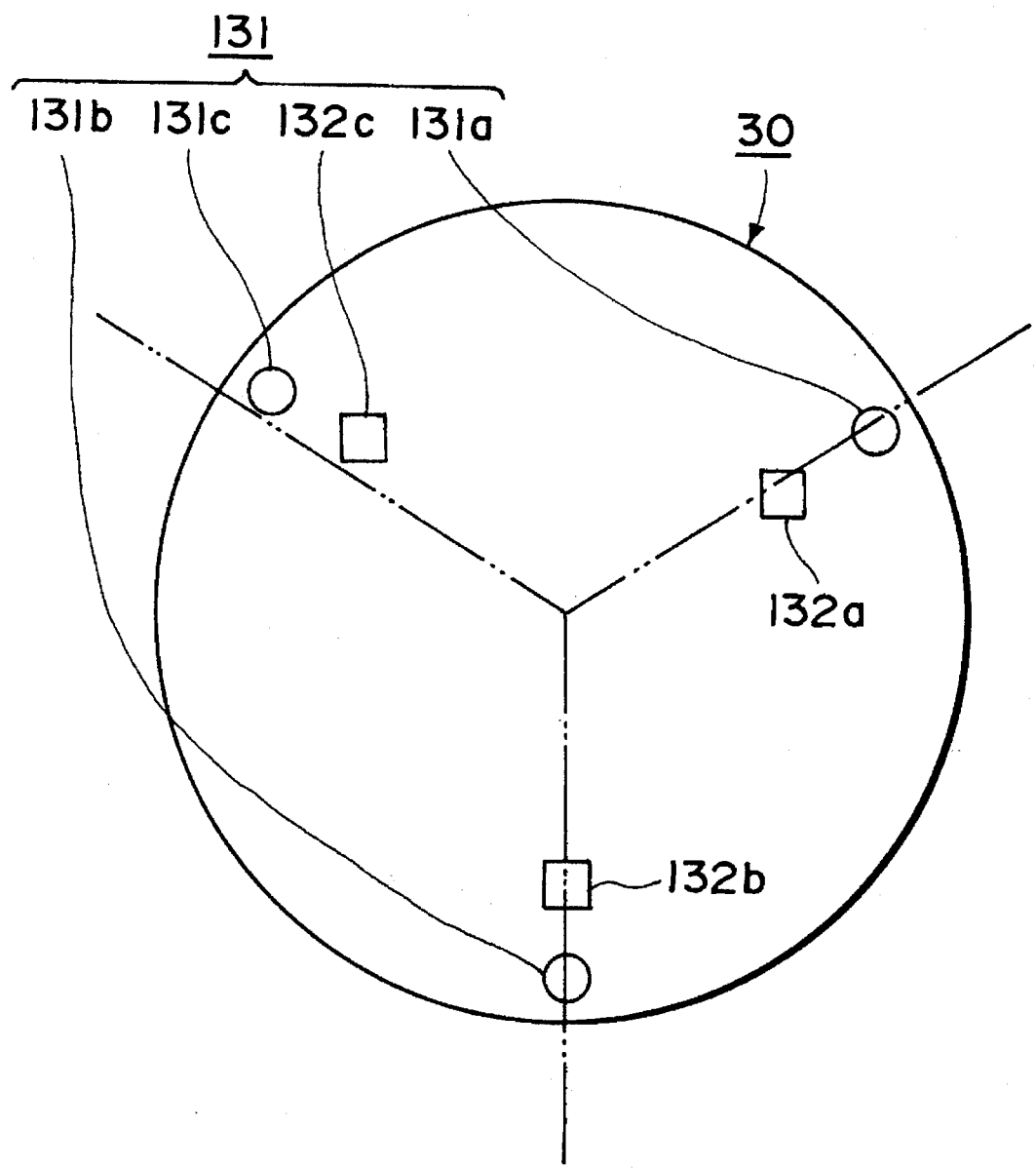
FIG. 7 is a schematic view of a Z-axis tilt stage of the first embodiment.

FIG. 7 is a schematic and elevational view of the Z-axis tilt stage 13. It comprises an inclination angle detecting device having three gap sensors 131a–131c for detecting, at equidistant positions in the peripheral direction, the position of the wafer chuck 30 in the Z-axis direction, as well as three Z actuators 132a–132c for driving, in the Z-axis direction, three points of the wafer chuck 30, which are equidistant positions in the peripheral direction of the wafer chuck. The Z actuators 132a–132c each comprises an inchworm drive type actuator to be driven by a piezoelectric device. The inclination angle detecting device 131 serves to detect the position of the wafer chuck 30 with respect to the Z-axis direction, as well as the inclination angles wx and wy (hereinafter, "wx current position" and "wy current position") of the wafer chuck 30 with respect to the Z axis. On the basis of the detected angles, the Z actuators 132a–132c are driven. It is to be noted that, by providing gap sensors and Z actuators close to each other and by using the gap sensors which are three in number and the actuators also three in number, all being disposed along a peripheral direction with a center angle 120 deg., the interference among the drive forces of the Z actuators is minimized.

Figure 8:
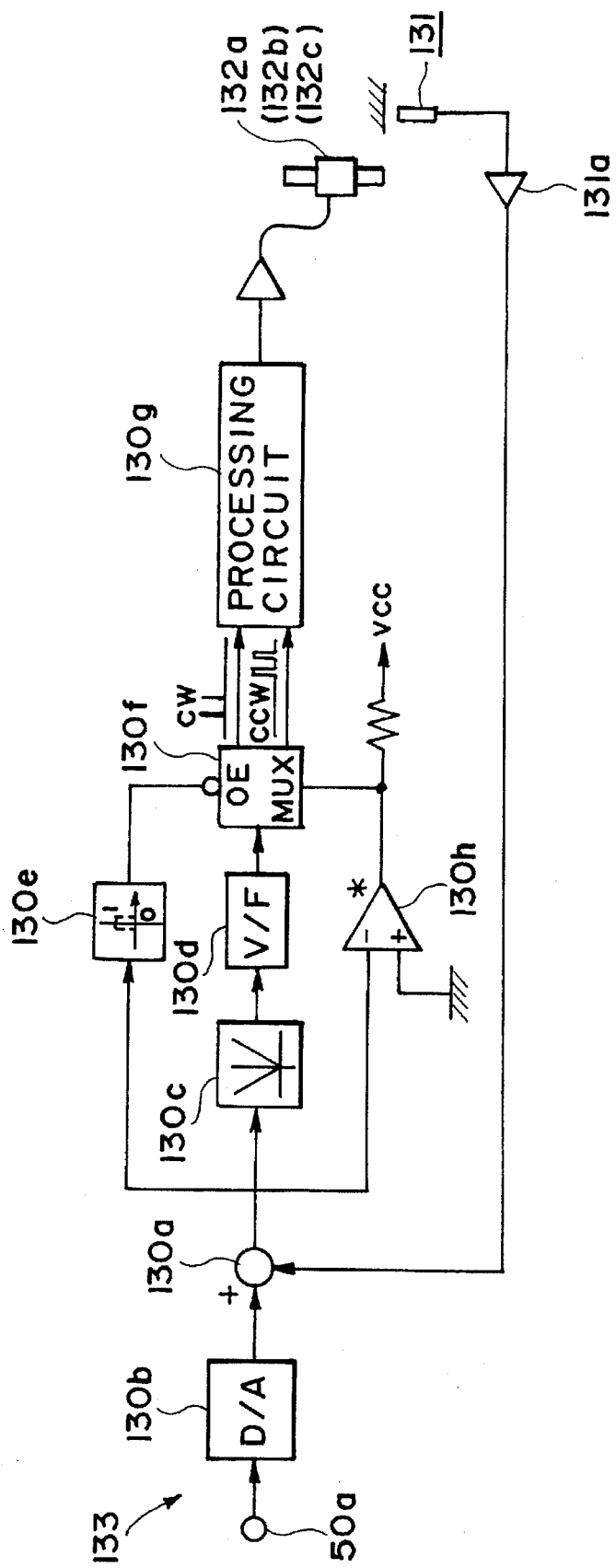
FIG. 8 is a block diagram for explaining Z actuators of the mechanism of FIG. 7.

FIG. 8 illustrates a driving circuit 133 for the Z actuators 132a–132c, which driving circuit is provided in the Z-axis tilt stage driving circuit 50c. This Z actuator driving circuit serves to perform closed loop control to the Z actuators 132a–132c. The current position measurement signal from the inclination angle detecting device 131 is applied to a differentiator 130a via a backup amplifier 131a. On the other hand, a Z command value as produced by the main computer 50a is transformed by a D/A converter 130b into an analog signal. The differentiator 130a detects the difference between this analog signal and the current position, by which a differential signal is produced. This differential signal is applied to an absolute value circuit 13c. The signal output therefrom, being an absolute value, is transformed by a V/F converter 130d into a pulse train. Direction discriminating circuit 130e produces a logic signal for designating the driving direction on the basis of the polarity of the differential signal. Multiplexer 130f distributes the received pulse train, between the forward direction and the reverse direction, in accordance with the logic level of the logic signal, and outputs the same to a driver-side processing circuit 130g for the Z actuators 132a–132c. The processing circuit 130g is arranged to produce a positional displacement of a constant amount in response to reception of one pulse. It is equivalent to an integrator. Stoppage discriminating circuit 130h serves to prevent the output of driving pulses when the differential signal is within a predetermined precision range and even when the difference is not exactly equal to zero. This effectively minimizes vibration due to an unnecessary servo error after completion of the positioning operation.

Figure 9:
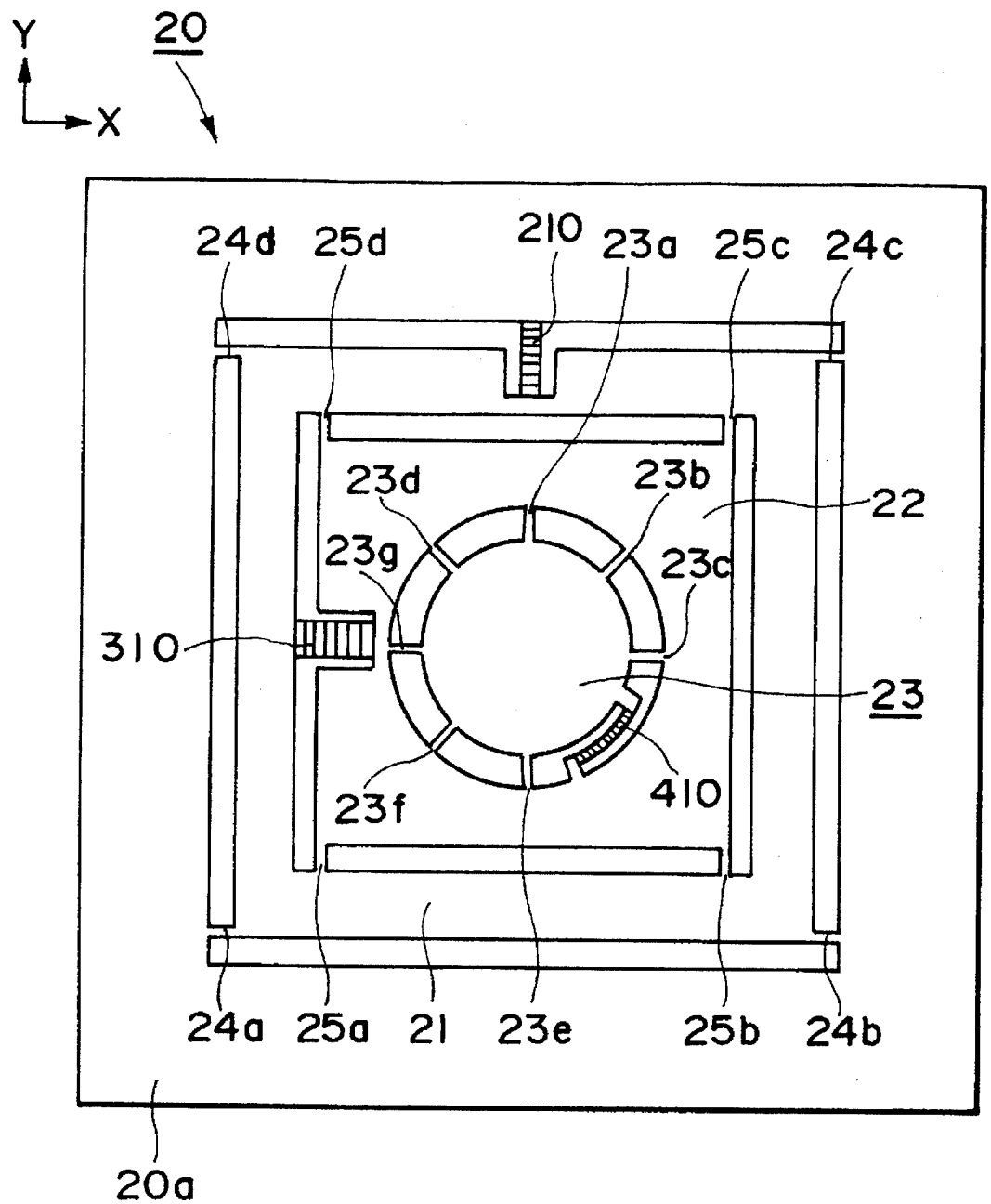
FIG. 9 is a schematic view of a fine-motion stage mechanism and a fine-rotation stage of the first embodiment.

FIG. 9 illustrates the fine-motion stage mechanism 20. The Y-axis fine-motion stage 21 is supported for reciprocal motion by a small amount only in the Y-axis direction, relatively to a frame 20a, by four leaf springs 24a–24d. Similarly, the X-axis fine-motion stage 22 is supported for reciprocal motion by a small amount only in the X-axis direction, relatively to the Y-axis fine-motion stage 21, by four leaf springs 25a–25d. The Y-axis fine-motion stage 21 and the X-axis fine-motion stage 22 are driven in the respective directions described above, by the Y piezoelectric device 210 and the X piezoelectric device 310, respectively. The Y piezoelectric device 210 is controlled by the piezoelectric device driving circuit 201 described hereinbefore, and it is also the case with the X piezoelectric device 310. The fine-rotation stage 23 is supported by a plurality of leaf springs 23a–23g which are provided equidistantly in the same direction between it and the X-axis fine-motion stage 22. The fine-motion stage 23 is driven by the wz piezoelectric device 410 along the peripheral direction.

Figure 10:
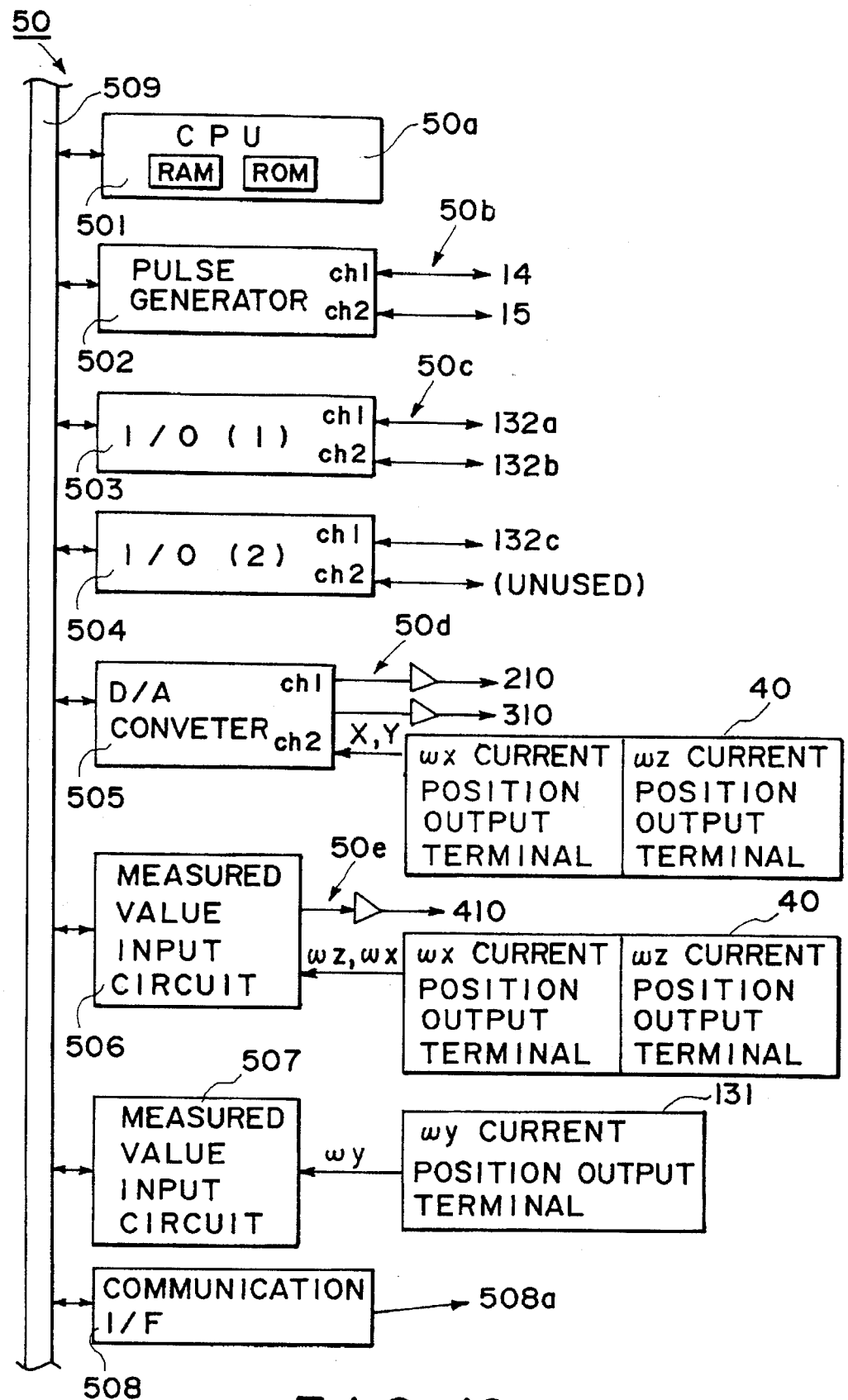
FIG. 10 is a diagram for explaining a controller of the first embodiment.

FIG. 10 illustrates the structure of the controller 50. It comprises a plurality of circuit bases 501–508 and a main bus 509 for providing electric connection among them. First circuit base 501 has a CPU (computing operational means of the main computer 50a) and memory means mounted thereon. Second circuit base 502 has mounted thereon a rough-motion stage driving circuit 50b having the pulse generator 17a described above as an input terminal. It serves to actuate the Y power cylinder 14 of the Y-axis rough-motion stage 11 and the X power cylinder 15 of the X-axis rough-motion stage 12. Third and fourth circuit bases 503 and 504 have mounted thereon divided portions of a Z-axis tilt stage driving circuit 50c for driving the Z-axis tilt stage 13, and they serve to drive the Z actuators 132a–132c. Fifth circuit base 505 has mounted thereon a fine-motion stage mechanism driving circuit 50d. It comprises piezoelectric device diving circuit means for driving the Y piezoelectric device 210 of the Y-axis fine-motion stage 21 and the X piezoelectric device 310 of the X-axis fine-motion stage 22, respectively, in accordance with the outputs of the current position detecting device 40 at its Y current position output terminal and its X current position output terminal, respectively, and/or with the open loop command value or closed loop command value from the main computer 50a. The structure of this piezoelectric device driving circuit means is such as has been described with reference to FIG. 2.

Sixth circuit base 506 has a fine-rotation stage driving circuit 50e mounted thereon and, also, in cooperation with seventh circuit base 507, it holds a measure value input circuit into which the wz current position, the wx current position and the wy current position of the wafer chuck 30 applied from the current position detecting device 40 and the inclination angle detecting device 131, are supplied. Eighth circuit base 508 has a communication interface circuit mounted thereon, and data transfer between the positioning system and any external mechanism or triggers for synchronous operation are performed via a communication path 508a.

The positioning system of this embodiment performs the positioning operation for the wafer chuck 30 in accordance with the positioning sequence as illustrated in FIG. 11. Initially, at step S101, the target position for the wafer chuck 30 is converted into a corresponding number of pulses for driving the Y power cylinder 14 of the Y-axis rough-motion stage 11 and the X power cylinder 15 of the X-axis rough-motion stage 12. At step S102, the wx current position and the wy current position as detected by the inclination angle detecting device 131 are read, and the read positions are stored in memory means of the main computer 50a. At steps S103, the number of pulses mentioned above is set in the pulse generator of the rough-motion stage driving circuit 50b. Simultaneously, at step S104, the piezoelectric device driving circuit for the Y piezoelectric device 210 of the Y-axis fine-motion stage 21 and X piezoelectric device 310 of the X-axis fine-motion stage 22, is switched from the closed loop controlled state to the open loop controlled state in accordance with the command value changing sequence R10 described hereinbefore. At step S105, whether step 103 and step 104 are completed, is checked. If done, at step S106 the Y power cylinder 14 of the Y-axis rough-motion stage 11 and the X power cylinder 15 of the X-axis rough-motion stage 12 are driven. After a wait at step 107 until the remaining vibration attenuates, at step S108 the X current position and the Y current position are detected through the current position detecting device 40. At step S109, the X current position and the Y current positions are compared with an X target position and a Y target position, respectively, and whether the difference therebetween satisfies a predetermined condition, for example, whether it is not greater than 1 micron. If this condition is not satisfied, at step S110 the number of pulses for position correction is calculated, and at step S111 the correction pulse number is set in the pulse generator. Then, the sequence goes back to step S106.

If in step S109 the above-described condition is satisfied, at step S112 the wx current position and the wy current position are compared with the valued in the preceding operation, and the differences are applied to the Z actuators 132a–132c of the fine-rotation stage (Z-axis tilt stage) 13, as correction values. These differential values are produced due to distortion of the guide surface, for example, for the Y-axis rough-motion stage 11 or the X-axis rough-motion stage 12. Simultaneously with step S112, at step S113 the piezoelectric device device driving circuit for the Y piezoelectric device 210 and the X piezoelectric device 310 of the fine-motion stage mechanism 20 is switched from the open loop controlled state to the closed loop controlled state, and they are driven in this mode. At step S114, precision is checked. If there remains residual vibration, a predetermined wait is effected at step S115. If the residual vibration does not attenuate, it is considered as a time-out error and step S116 enters an error processing sequence.

Figure 12:
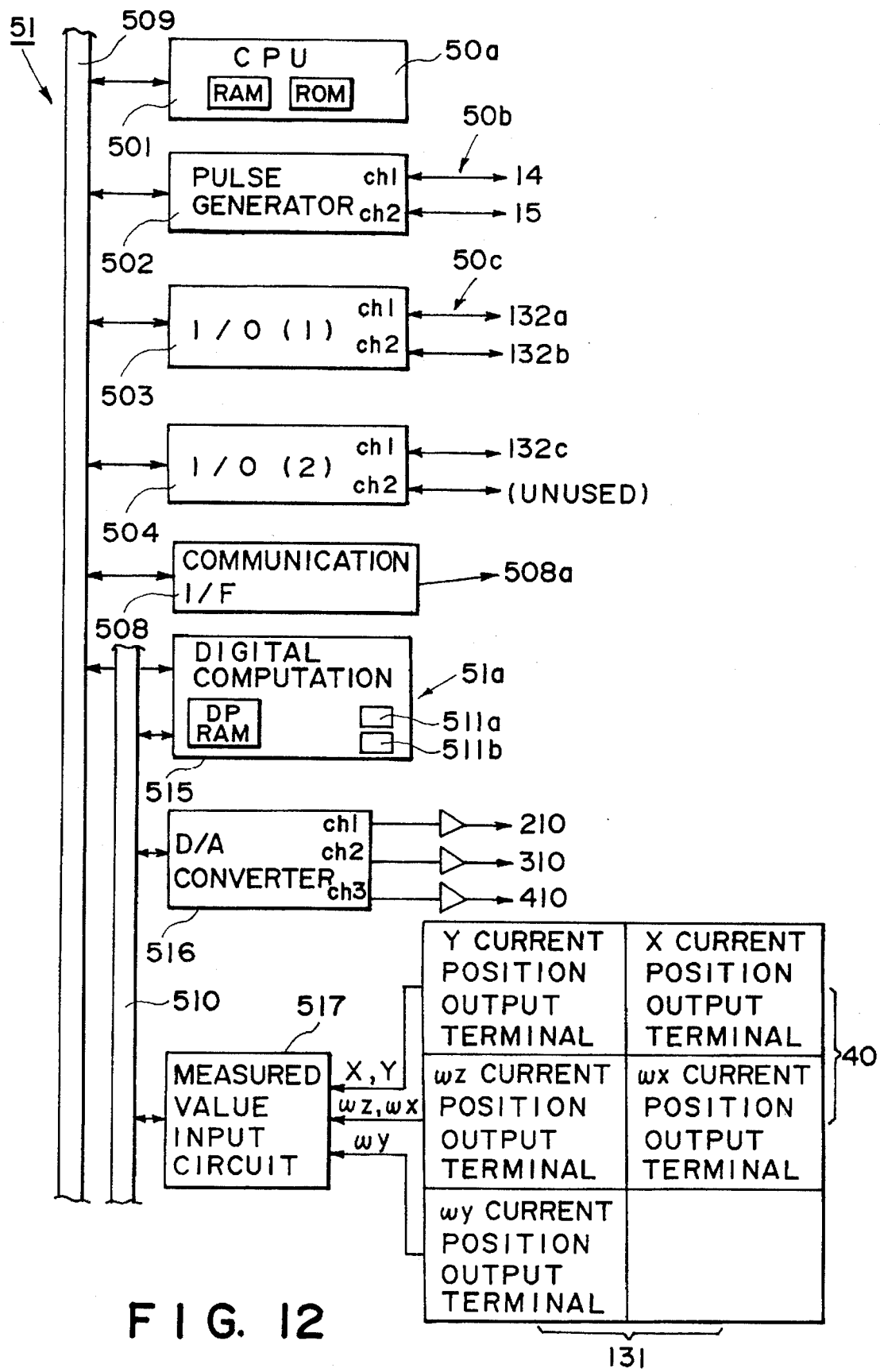
FIG. 12 is a chart for explaining a controller according to a modified form of the first embodiment.
Figure 13:
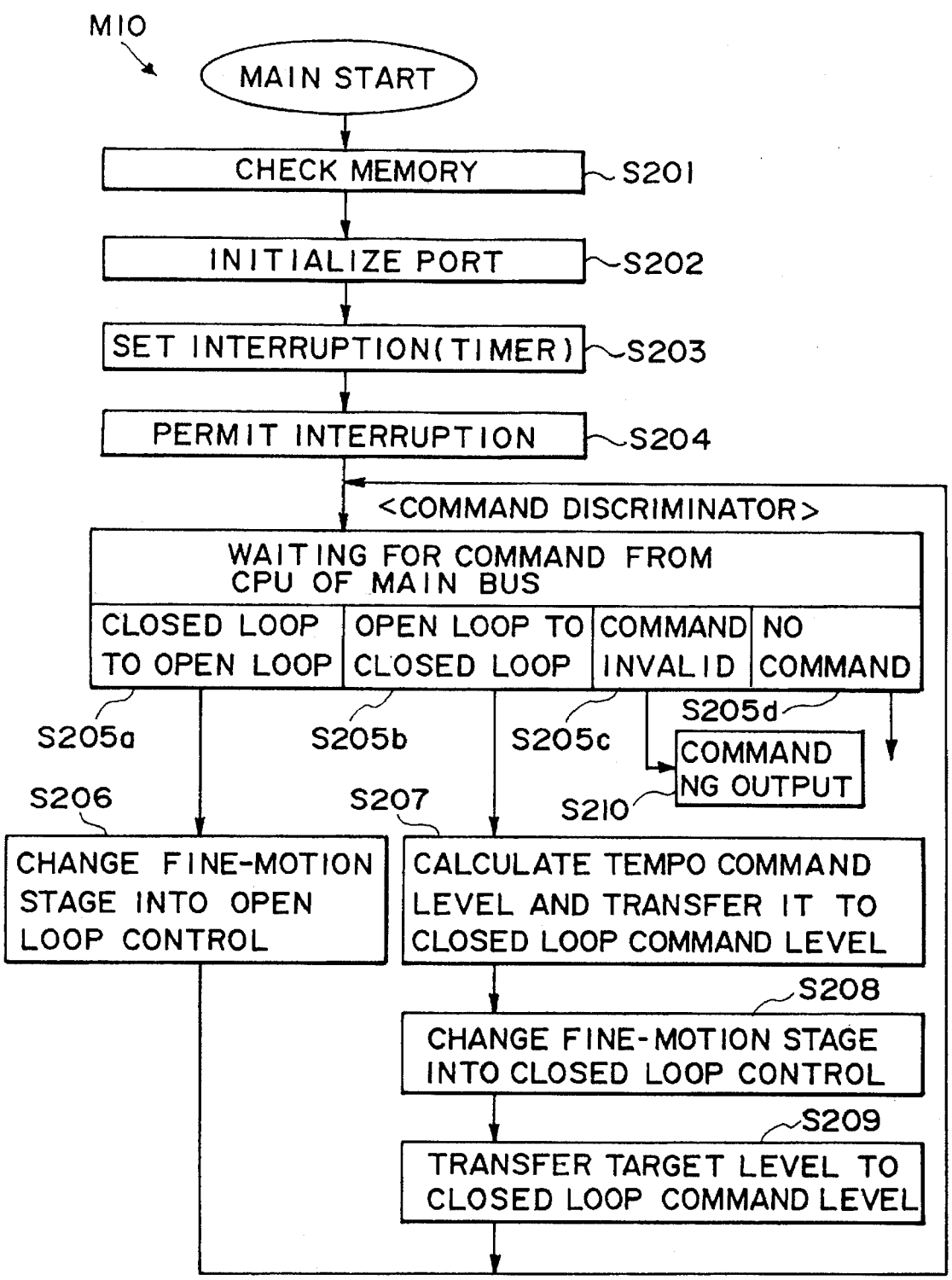
FIG. 13 is a chart for explaining a local bus main sequence according to the modified form of FIG. 12.

FIG. 12 illustrates a controller 51 of a modified form of the first embodiment. In this arrangement, the fifth to seventh circuit bases 505–507 of the controller 50 of the first embodiment are so modified that: Fifth circuit base 515 has a local bus computer 51a mounted thereon for local and high-speed communication of signals related to the fine-motion stage mechanism 20, and this circuit base is connected to a main bus 509. Sixth circuit base 516 has mounted thereon piezoelectric device driving circuits for the Y piezoelectric device device 210, the x piezoelectric device 310 and the wz piezoelectric device 410. Seventh circuit base 517 has mounted thereon a measured value input circuit to which outputs of the current position detecting device 40, namely, the Y current position, the X current position and the wz current position of the wafer chuck 30, as well as the outputs of the inclination angle detecting device 131, namely, the wx current position and the wy current position of the wafer chuck 30, are to be applied. The sixth circuit base 516 and the seventh circuit base 517 are connected to the local bus computer 51a via a local bus 510. The local bus computer 51a has a dual port random access memory RAM for the access to the sixth and seventh circuit bases 516 and 517, and software for executing data processing in accordance with a local bus main sequence M10 and first and second timer interruption sequences T10 and T20, to be described later. These software include a sequential command value table 511a for designating open loop command values and closed loop command values for the Y piezoelectric device 210, the X piezoelectric device 310 and the wz piezoelectric device 410 which change with the procedure of the local bus main sequence as shown in FIG. 13. Hereinafter, these open loop and closed loop command values will be referred to respectively as "Y open loop command value (sequential)", "X open loop command value (sequential)", "wz open loop command (sequential)", "Y closed loop command value (sequential)", "X closed loop command (sequential)" and "wz closed loop command (sequential)". Also, the software include a final command value table 511b for memorizing target values (X, Y and wz target positions) of the respective command values as applied beforehand to the local bus computer 51a via the main bus 50. Hereinafter, theses target values will be referred to respectively as "Y open loop command value (final)", "X open loop command (final)", "wz open loop command (final)", "Y closed loop command value (final)", "X closed loop command (final)" and ("wz closed loop command (final)". Further, the software include operation processing means for executing predetermined digital operations.

The local bus main sequence M10 serves to switch the piezoelectric device driving circuits for the Y piezoelectric device 210, the X piezoelectric device 310 and the wz piezoelectric device 410, respectively, from the closed loop controlled state to the open loop controlled state or, alternatively, in the reverse way. As shown in FIG. 13, at step S201 a memory check is performed in response to the power charge or assertion of a system reset. At step S202, peripheral ports are initialized, and the setup of operational environment is checked. At step S203, interruption intervals of the first and second timer interruption sequences T10 and T20 are set. At step S204, interruption is permitted.

In the first timer interruption sequence T10, voltages to be applied to respective D/A converters of the respective piezoelectric device driving circuits for the Y piezoelectric device 210, the X piezoelectric device 310 and the wz piezoelectric device 410, are calculated and corresponding outputs are produced. In the second timer interruption sequence T20, the current position data applied from the measured value input circuit of the seventh circuit base 507 is stored periodically into a current position data table FIFO with in the memory of the local bus computer 51a.

If a command for switching from the closed loop controlled state to the open loop controlled state is applied to a command discriminator of the local bus computer 51a from the main computer 50a (step S205a), at step S206 the fine-motion stage mechanism is changed from the closed loop controlled state to the open loop controlled state in accordance with the command value changing sequence R10. More specifically, drive voltages (controlled variants) of the Y piezoelectric device 210 and the X piezoelectric device 310 as being A/D converted are transferred to the open loop command values of the respective piezoelectric device driving circuits in accordance with the command value changing sequence such as described with reference to FIG. 3. Then, the piezoelectric device driving circuits of the Y piezoelectric device 210 and the X piezoelectric device 310 are switched, such that the closed loop command values are gradually shifted to the Y open loop command value (final) and the X open loop command value (final) as memorized in the final command value table 511b.

When on the other hand, a command for switching from the open loop controlled state to the closed loop controlled state is applied to the command discriminator of the local bus computer 51a from the main computer 50a (step S205b), at step S207 a tentative command value (controlled variant) is calculated on the basis of the data in the current position data table FIFO, and this is transferred to the closed loop command value for the respective piezoelectric device driving circuits. At step S208, the piezoelectric device driving circuits of the Y piezoelectric device 210 and X piezoelectric device 310 are switched, so as to switch the fine-motion stage mechanism from the open loop controlled state to the closed loop controlled state. After this, at step S209, the Y closed loop command value (final) and the X closed loop command value (final) of the final command value table 511b are transferred to the closed loop command values of the respective piezoelectric device driving circuits.

In this modified form, as described, also when the open loop controlled state is to be switched to the closed loop controlled state, the control amount as determined from the date in the current position data table FIFO is applied, before the switching operation, to the closed loop command values of the respective piezoelectric device driving circuits. It is therefore not necessary to use first and second branch lines 211 and 212 such as shown in FIG. 2, for applying the output $v_0$ of the open loop drive line 208 to the closed loop drive line 209. Thus, advantageously the structure is simpler.

If, even in the closed loop controlled state a command for switching from the open loop controlled state to the closed loop controlled state is applied from the command discriminator of the local bus computer 51a from the main computer 50a or vice versa (step S205c), such command is invalidated at step S210 and the status of the final command value table 511b is transmitted to the main computer 50a. Waiting or a polling state follows it, similar to a case without a command (step S205d).

FIG. 15 is a chart for explaining the first timer interruption sequence T10. The interruption interval of the timer interruption sequence T10 is restricted by the time necessary for the operational procedure in the local bus computer 51a. The shorter the interruption interval, the more accurate and better the response control. However, the time to be consumed by the operational processing is reduced and the amount of calculation increases. With currently available techniques, usually it may be set to 0.1–1 msec.

In the time interruption sequence T10, at step S301, whether the piezoelectric device driving circuits of the Y piezoelectric device 210 and the X piezoelectric device 310 are in the closed loop controlled state or in the open loop controlled state is discriminated, this being done on the basis of the control status of the sequential command value table 511a. If it is in the closed loop controlled state, at step S302 the latest measured values on the Y current position and the X current position, or these values together with the wz current position, the wx current position and the wy current position, or alternatively, the data related to the measured valued having been produced in the past few operations, are read out from the current position data table FIFO.

The thus read data is digital-filter processed at step S303, and the result of the operation is outputted to the D/A converters of the Y piezoelectric device 210, the X piezoelectric device 310 and the wz piezoelectric device 410, at step S304, whereby the interruption is completed.

If at step S301 the closed loop controlled state is discriminated, the X open loop command value (sequential), the Y open loop command value (sequential) and the wz open loop command value (sequential) of the sequential command value table 511a are directly applied to corresponding portions of the D/A converters.

Figure 16:
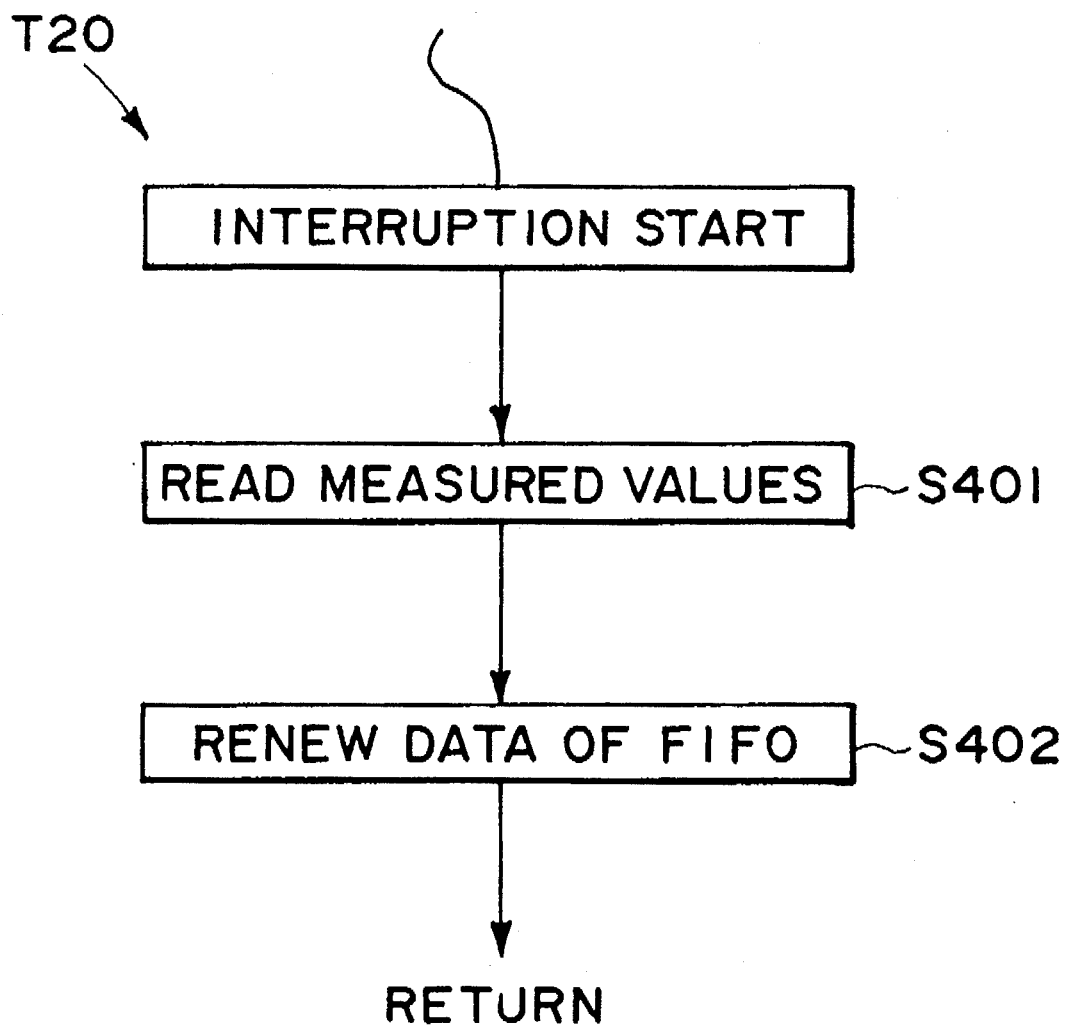
FIG. 16 is a chart for explaining a second timer interruption sequence in the local bus main sequence of FIG. 13.

FIG. 16 is a chart for explaining the second timer interruption sequence T20. The interruption interval of the second timer interruption sequence T20 is set on the basis of the sampling interval of the laser interferometers of the current position detecting device 40 and the inclination angle detecting device 131. Usually, it is about 1/10 of the interruption interval of the first timer interruption sequence T10. In the second timer interruption sequence T20, at step S401 the measured values of the laser interferometers are read. At step S402, the data in the current position data table FIFO is renewed, whereby the interruption is completed.

Figure 14:
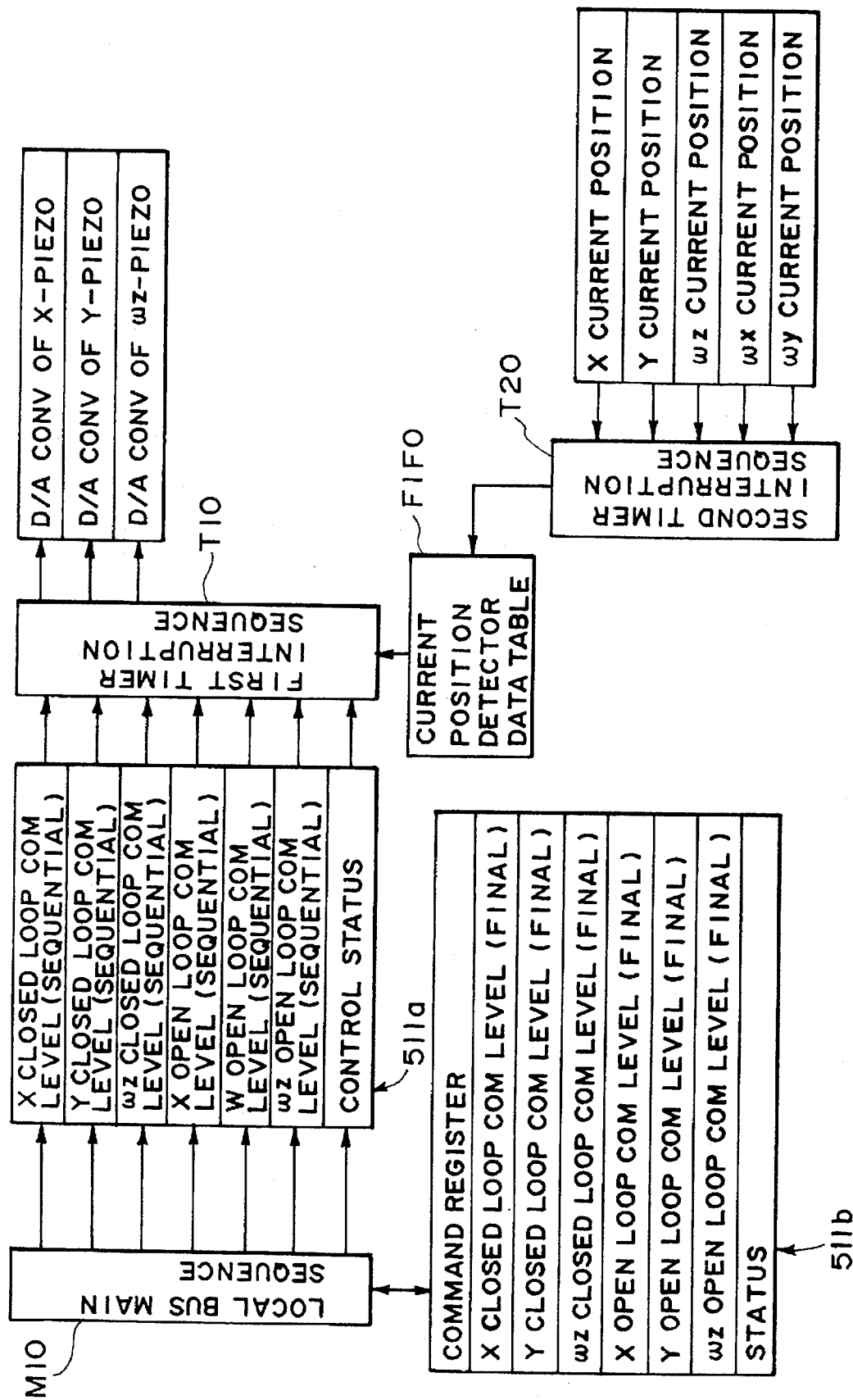
FIG. 14 is a data flow chart for explaining the flow of data in the local bus computer according to the modified form of FIG. 12.

The flow of data in accordance with the local bus main sequence M10, the first timer interruption sequence T10 and the second timer interruption sequence T20, is such as illustrated in FIG. 14. First, a command register of the final command value table 511b receives a command value changing command from the main computer 50a of the main bus 509. If the system is to be switched to the closed loop controlled state, the X, Y and wz closed loop command values (final) are supplied from the main computer 50a of the main bus 509, whereas, if the system is to be switched to the open loop controlled state, the X, Y and wz open loop command values (final) are supplied. It is checked by the status. With the execution of the command value changing process according to the local bus main sequence M10, the X, Y and wz closed loop command values (sequential) or the X, Y and wz open loop command values (sequential) in the sequential command value table 511a are sequentially rewritten. At the end of the local bus main sequence M10, these values correspond to the data in the final command value table 511b. In the first timer interruption sequence T10, the operational processing is performed by using the data in the sequential command value table 511a as determined at the time of completion of the local bus main sequence M10 and by using measured values as having been read in the second timer interruption sequence T20. The result of operation is outputted to the respective D/A converters. The control status of the successive command value table 511a represents one of the closed loop controlled state and the open loop controlled state into which the system is being switched.

Figure 17:
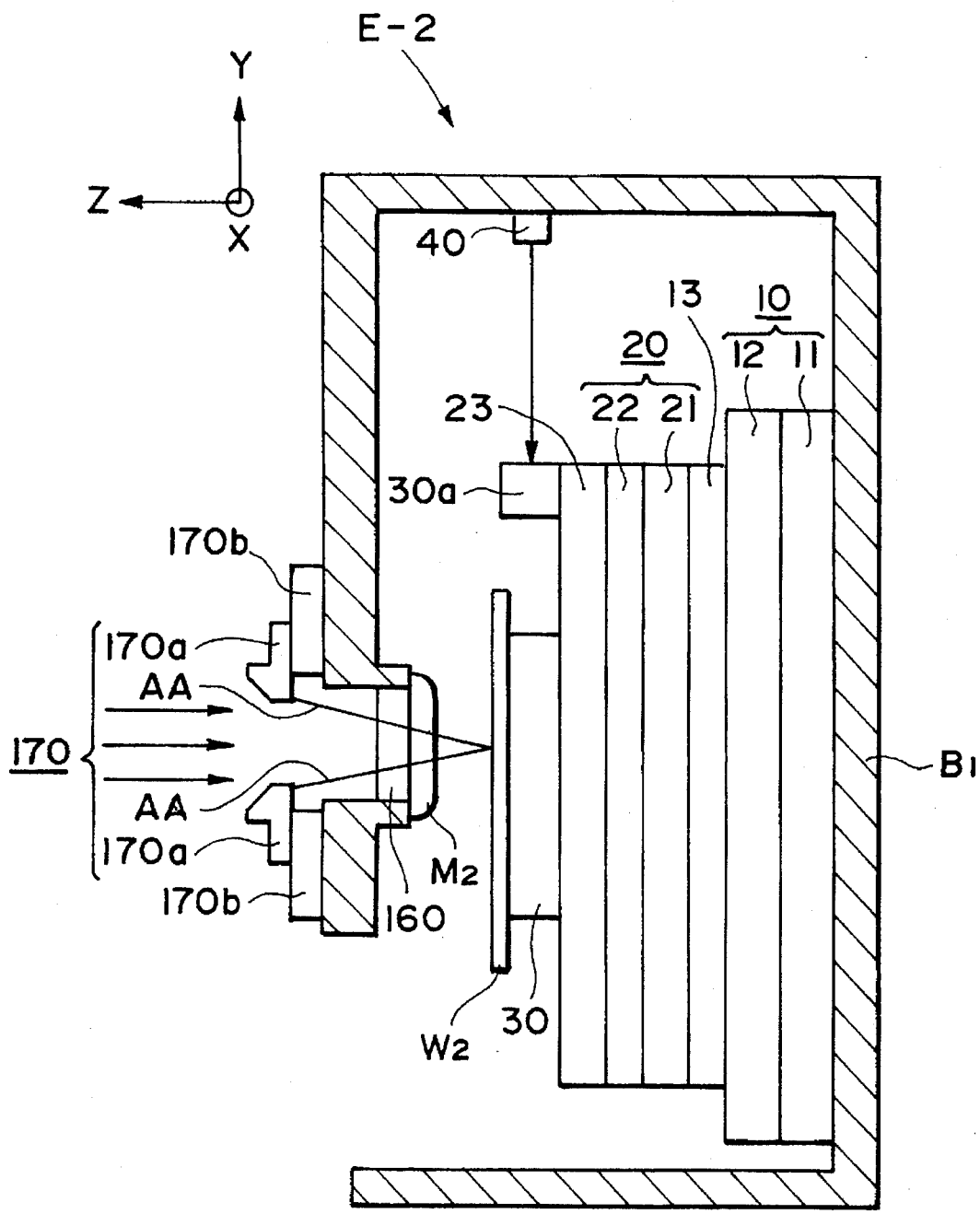
FIG. 17 is a schematic view of a general structure of a positioning system according to a second embodiment of the present invention.

FIG. 17 shows a general structure of a positioning system E-2 according to a second embodiment of the present invention. The positioning system comprises a rough-motion stage mechanism 10 having a Y-axis rough-motion stage 11 and an X-axis rough-motion stage 12, a fine-motion stage mechanism 20 having a Y-axis fine-motion stage 21 and an X-axis fine-motion stage 22, and a fine-rotation stage 23, as in the first embodiment. In addition to an absolute position control system which is a control system for performing positioning (hereinafter, "absolute position control") with respect to a target position as memorized in a main computer 600 (FIG. 18) as in the first embodiment, there is provided a real-time autoalignment (AA) control system which is a control system that serves to detect, after completion of the positioning operation, a positional deviation between a mask $M_2$ held by a mask holder 160 and a wafer $W_2$ held by a wafer chuck 30, by use of an alignment optical system 170, and is arranged to change drive voltages of the Y piezoelectric device and the X piezoelectric device on the basis of the detected positional deviation. Thus, what can be called real-time AA control is done to remove any transfer error due to the positional deviation between the mask $M_2$ and the wafer $W_2$ during the exposure process.

Figure 18:
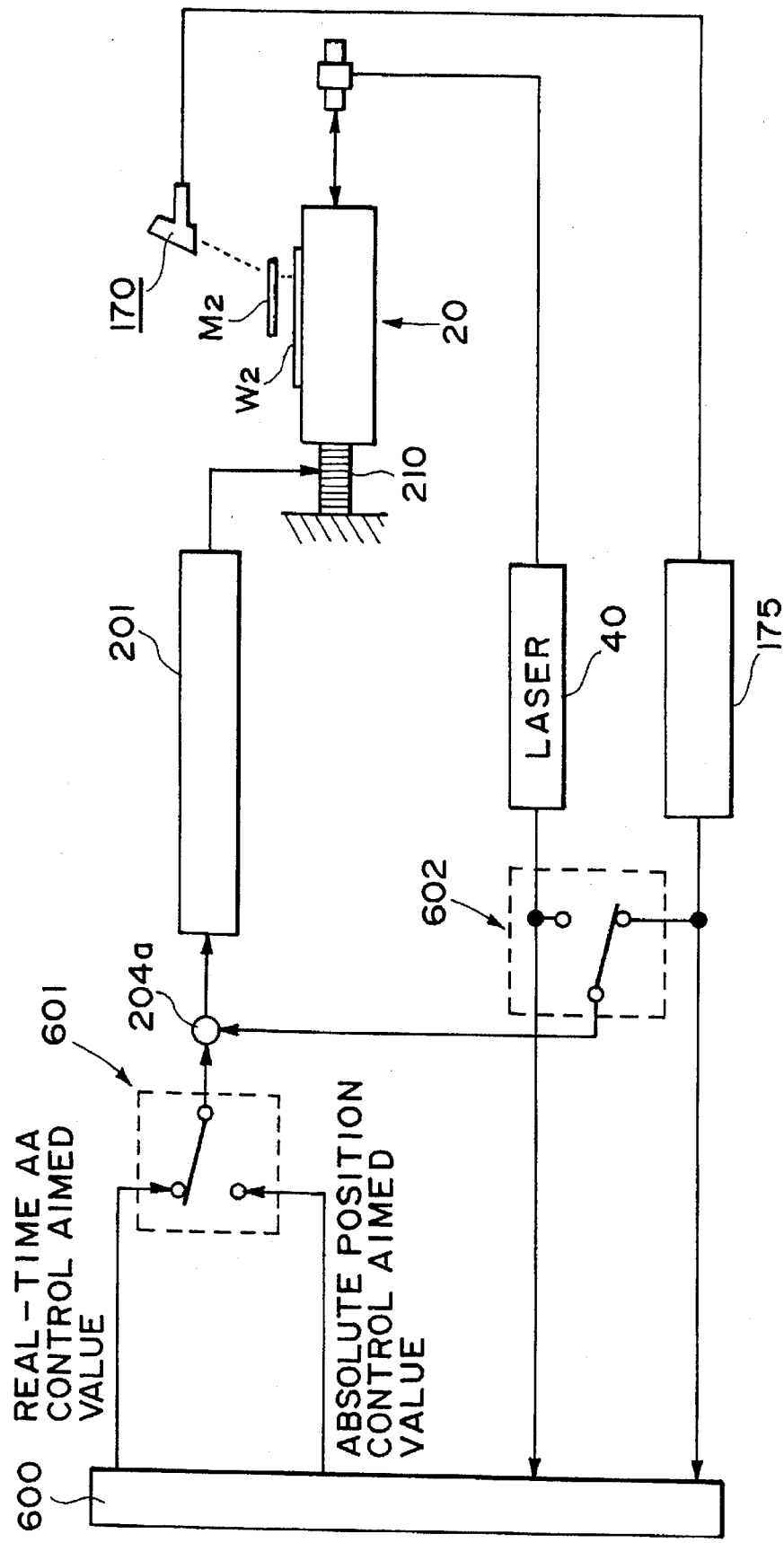
FIG. 18 is a schematic view for explaining a control system of a fine-motion stage mechanism according to the second embodiment.

More specifically, as illustrated in FIG. 18, a first switch 601 is provided upstream of a differentiator 204a of a piezoelectric device driving circuit 201 (FIG. 2) for controlling a Y piezoelectric device 210, by which one of a real-time AA control target value having been set in the main computer 600 beforehand and an absolute position control target value which is a target value to be sequentially renewed, is selectively applied as a command value to the differentiator 204a. Also, by means of a second switch 602 which is operable in synchronism with the first switch 601, the subtraction value to be applied to the differentiator 204a is selectively switched to one of the output of a current position detecting device 40 and the output of the alignment optical system 170. The X piezoelectric device not shown in the drawing is controlled in a similar way.

The Y-axis rough-motion stage 11, the X-axis rough-motion stage 12, the Y-axis fine-motion stage 21, the X-axis fine-motion stage 22, the fine-rotation stage 23, Z-axis tilt stage 13, the current position detecting device 40 and the piezoelectric device driving circuit 201 have substantially the same structure as of the first embodiment, explanation of these components is omitted here by assigning corresponding elements to them.

The alignment optical system 170 comprises four pickups 170a adapted to project alignment light AA to four alignment marks MM (FIG. 19) as provided at four corners on the mask $M_2$ surface, to detect a positional deviation between the mask $M_2$ and the wafer $W_2$. These pickups 170a are held by pickup staged 170b.

Figure 19:
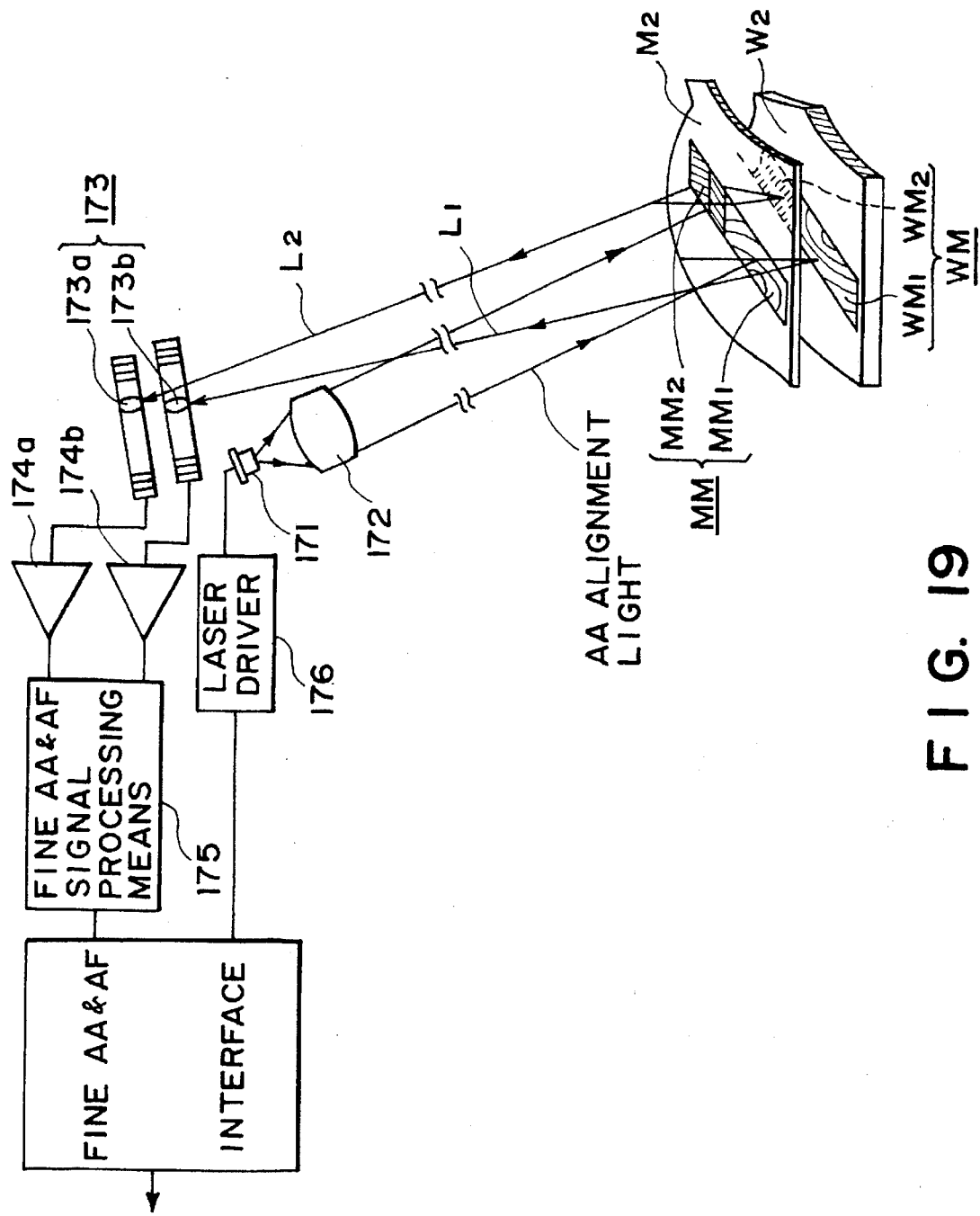
FIG. 19 is a schematic view for explaining a pickup of the system of FIG. 17.

The alignment light AA comprises a laser beam produced by a laser diode 171, in this embodiment, as shown in FIG. 19. The alignment light is projected through a collimator lens 172 to an alignment mark MM on the mask $M_2$, and light reflected by an alignment mark WM provided on the wafer $W_2$ is detected by a light receiving means 173, by which the positional deviation between the mask $M_2$ and the wafer $W_2$ is detected.

As regards the alignment marks WM of the wafer $W_2$ and the alignment marks MM of the mask $M_2$, there are AA mark elements $WM_1$ and $MM_1$ for detection of the positional deviation between the mask $M_2$ and the wafer $W_2$ along the X-Y plane, and AF mark elements $WM_2$ and $MM_2$ for detection of a change in spaced distance (gap) between the mask and the wafer along the Z-axis direction. The light receiving means 173 of the pickup 170a comprises light receiving elements 173a and 173b, for separately receiving reflected lights from the AA mark elements $WM_1$ and $MM_1$ and from the AF marks $WM_2$ and $MM_2$, respectively. The outputs of these light receiving elements are applied to fine AA and AF signal processing means 175 via amplifiers 174a and 174b, respectively. The AA and AF signal processing means 175 as well as a laser driver 176 for driving the laser diode 171 are connected to the main computer 600 via an interface 177. Thus, the alignment optical system 170 functions to detect, with four pickups 170a, the positional deviation components between the mask $M_2$ and the wafer $W_2$ with respect to three-axis directions (X-, Y- and Z-axis directions) (hereinafter, theses deviations will be referred to as the "$X_{AA}$ detected value", the "$Y_{AA}$ detected value" and the "wz $_{AA}$ detected value", respectively), as well as the rotational angles wx, wy and wz about the X, Y and Z axes.

In a case where the wafer chuck 30 has been positioned at a desired target position designated by the main computer 600 by use of the absolute position control system and if, prior to start of the exposure process, the control is switched to the real-time AA control based on the output of the alignment optical system 170, there is a possibility that the drive voltage of the piezoelectric device changes suddenly, causing a decrease in the life thereof or degradation of the connection between the stages.

In consideration thereof, there is a driving system switching sequence M110. This sequence is such that: Drive voltages of the piezoelectric devices which are control amounts just before the switching are A/D converted and the resultant values ("absolute position control values") are transferred to the real-time AA control target values. Thereafter, these values are shifted sequentially by regular amounts of 1%, toward the original values. When after completion of exposure of a predetermined exposure zone of the wafer $W_2$, the control is to be switched to the absolute position control for the exposure of a subsequent exposure zone, drive voltages of the piezoelectric devices which are control amounts just before the switching are A/D converted and the resultant values ("real-time AA control values") are transferred to the absolute position control target values. Thereafter, these values are shifted sequentially by regular amounts of 1%, toward the original values.

FIG. 20 is a chart for explaining the driving system switching sequence M110. At step S1001, a memory check is performed in response to a power charge of the computer or assertion of a system reset. At step S1002, peripheral ports are initialized, and the setup of operational environments is checked. At step S1003, the interruption intervals of first to third timer interruption sequences T110, T120 and T130 are set, and at step S1004, interruption is permitted.

As a command for switching from the absolute position control to the real-time AA control is applied to a command discriminator from the main computer (step S1005a), the absolute position control value is transferred to the real-time AA control target value (step s1006), and the absolute position control is switched to the real-time AA control (step S1007). Then, a first shunting amount corresponding to 1% of the transferred data $D_0$ (i.e. $D_0/100$) and a second shunting amount corresponding to 1% of the original real-time AA control target value $D_e$ (i.e. $D_e/100$) are calculated (step S1008). At step S1009, the first and second shunting amounts are shunted. After a predetermined wait at step S1010, the sequence goes back to step S1008. At step S1008, those shunting amounts of a proportion of 2% are calculated. The procedure from the step S1009 to step S1010 is repeated, until the proportion of the shunting amount becomes equal to 100%.

When a command for switching from the real-time AA control to the absolute position control is applied to the command discriminator from the main computer (step S1005b), the real-time AA control value is transferred to the absolute position control target value (step S1011), and at step S1012 the control is switched from the real-time AA control to the absolute position control. Then, a first shunting amount corresponding to 1% of the transferred data $E_0$ (i.e. $E_0/100$) and a second shunting amount corresponding to 1% of the original absolute position control target value $E_e$ (i.e. $E_e/100$) are calculated (step S1013). At step S1014, the first and second shunting values are shunted. After a wait of a predetermined time period at step S1015, the sequence returns to step S1013. At step S1013, those shunting amounts of a proportion of 2% are calculated, and the procedure from step S1014 to step S1015 is repeated until the proportion of the shunting amount becomes equal to 100%.

Even if, when the system is under the absolute position control, a command for specifying switching to the absolute position control or vice versa (step S1005c), a signal that invalidates that command is transmitted to the computer (step S1005d). Waiting or a polling state follows this, such as in a case of a no command situation (step S1005d).

Figure 21:
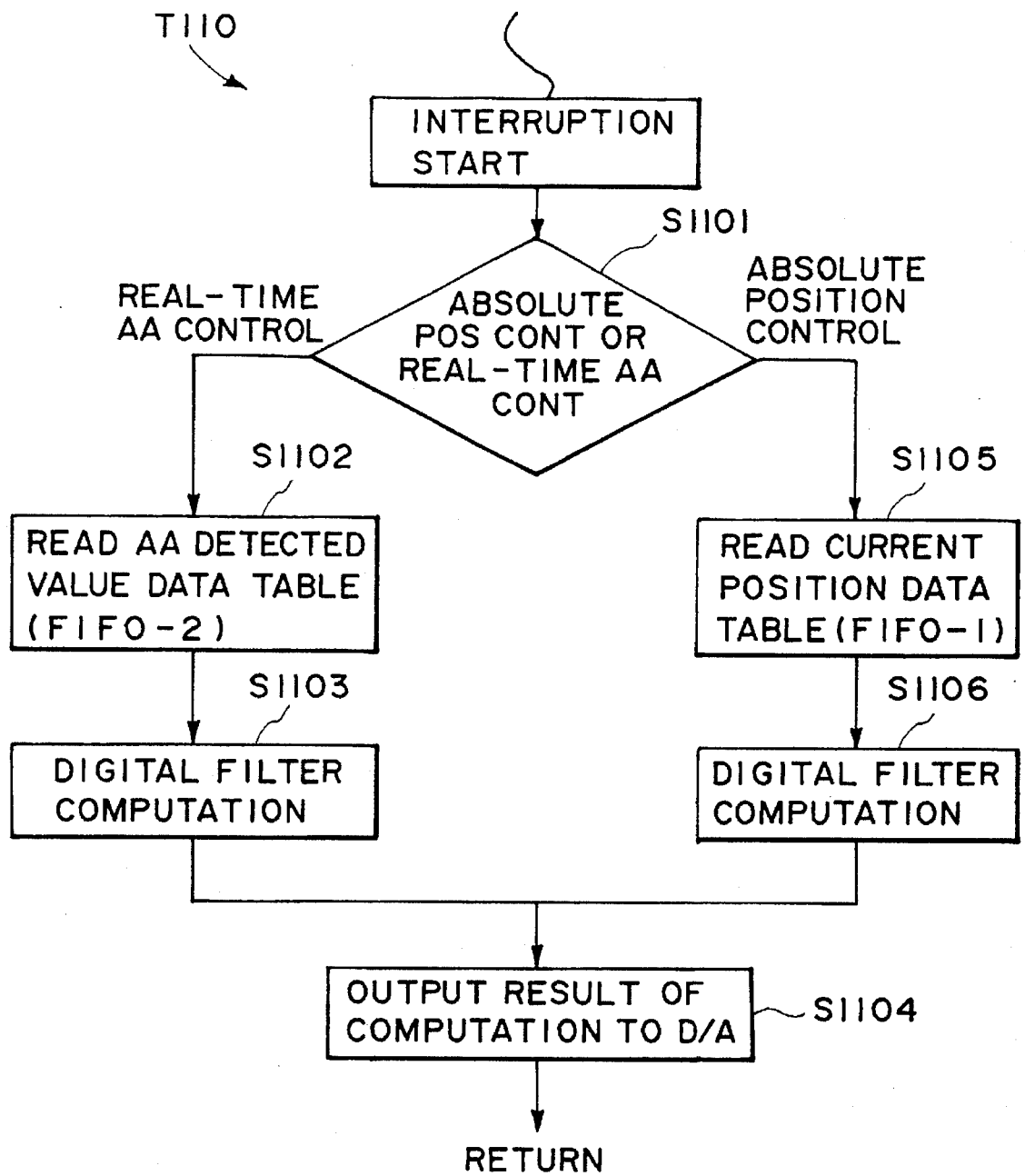
FIG. 21 is a chart for explaining a first timer interruption sequence of the driving system changing sequence of the second embodiment.

FIG. 21 is a chart for explaining the first timer interruption sequence T110. In this timer interruption sequence T110, at step S1101a, discrimination is made whether the piezoelectric device driving circuits are in the real-time AA control state or in the absolute position control state. If it is the real-time AA control state, at step S1102, the $X_{AA}$ detection value, the $Y_{AA}$ detection value and the $wz_{AA}$ detection value are read out of the AA detection value data table FIFO-2, having been prepared in accordance with the third timer interruption sequence T130, to be described later. At step S1103, operational processing is performed. The results are applied to A/D converters of the respective piezoelectric device driving circuits (step S1104). If at step S1101 it is discriminated as being the absolute position control state, at step S1105 the X current position, the Y current position and the wz current position are read out of the current position data table FIFO-1, having been prepared in accordance with the second timer interruption sequence T120, to be described later. At step S1106, an operational procedure is performed. The results are applied to the D/A converters of the respective piezoelectric device driving circuits, and the interruption is completed.

Figure 22:
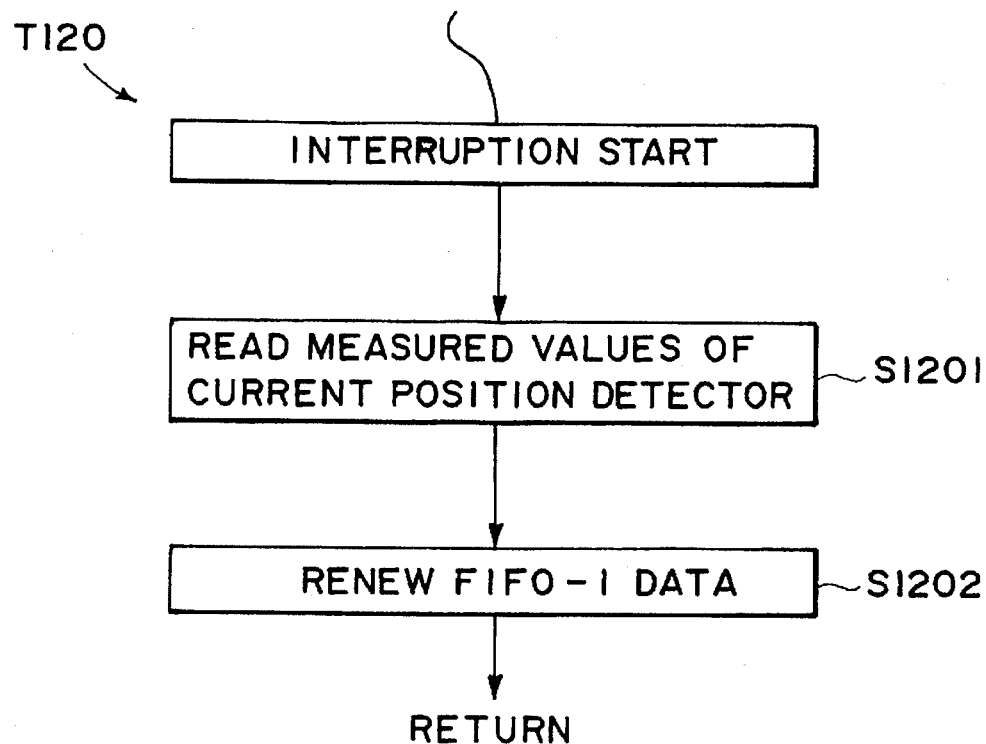
FIG. 22 is a chart for explaining a second timer interruption sequence of the driving system changing sequence of the second embodiment.

FIG. 22 is a chart of the second time interruption sequence T120. At step S1201, the measured values of the current position detecting device are read. At step S1202 the current position data table FIFO-2 is renewed, and the interruption is completed.

Figure 23:
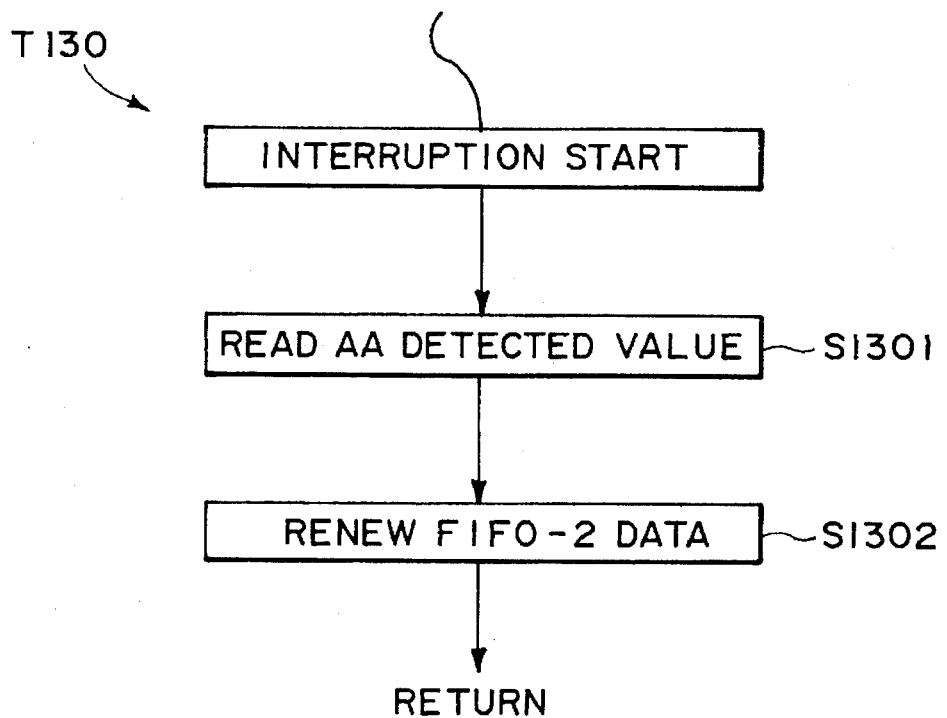
FIG. 23 is a chart for explaining a third timer interruption sequence of the driving system changing sequence of the second embodiment.
Figure 24:
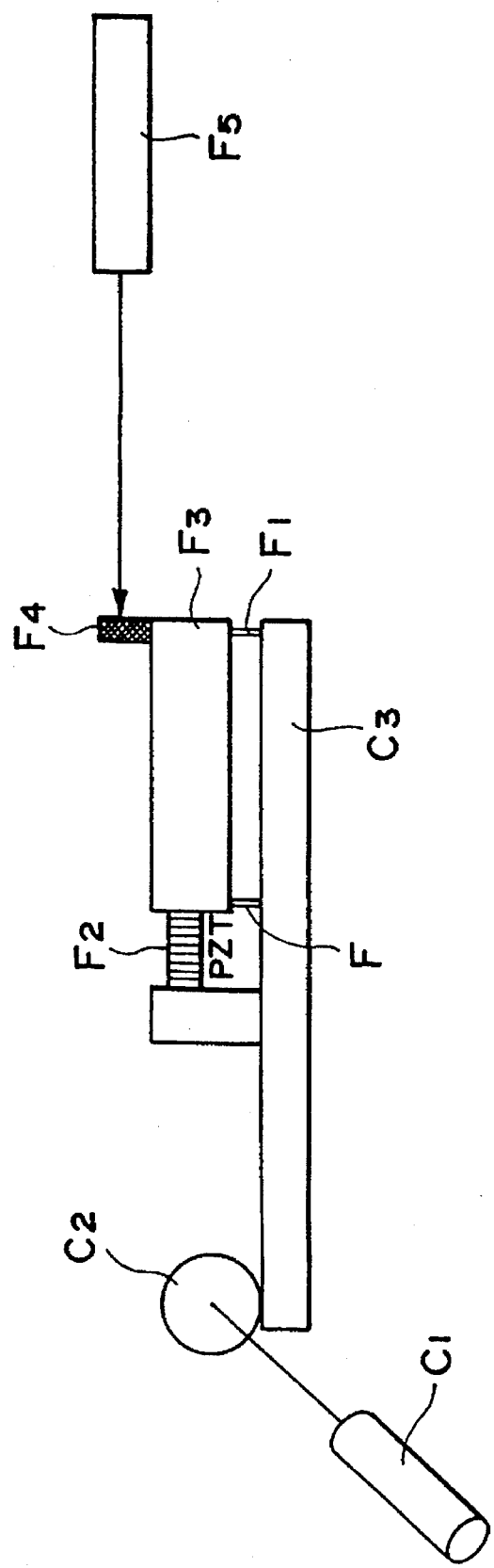
FIG. 24 is a schematic view for explaining the concept of a known type positioning system.
Figure 25:
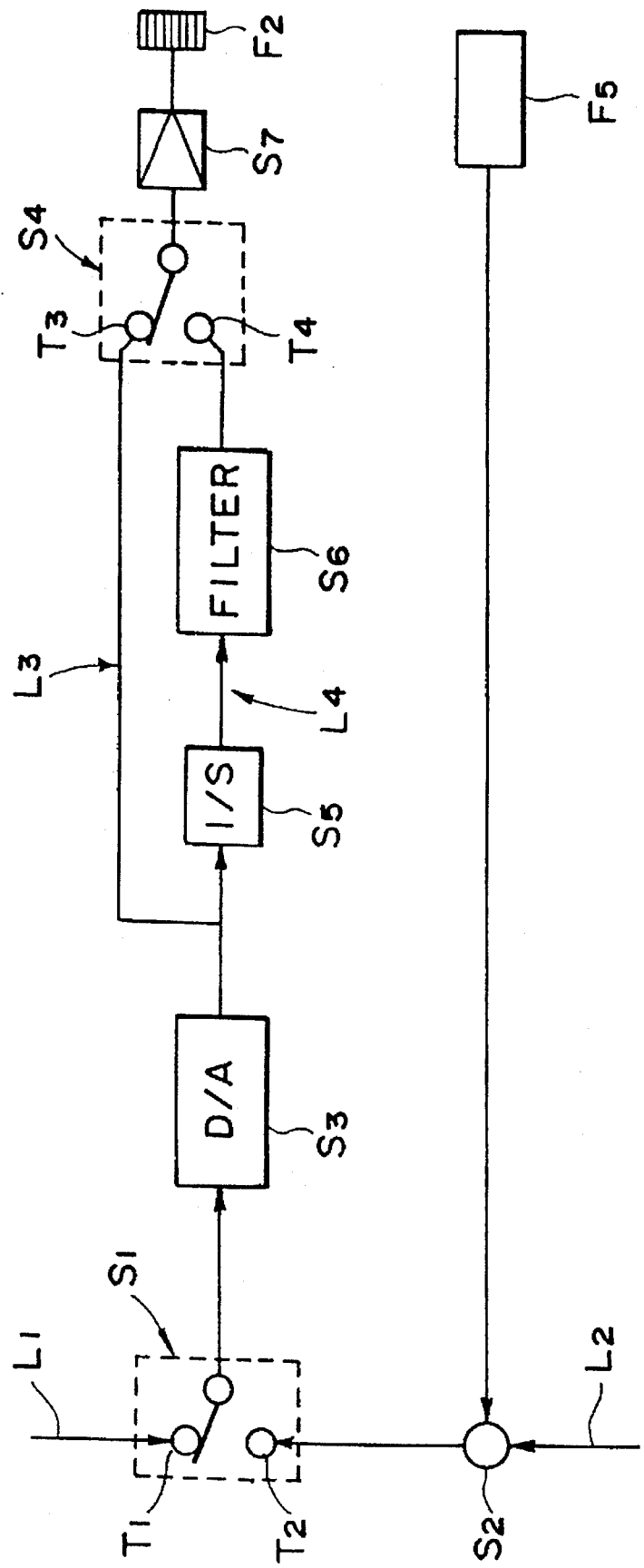
FIG. 25 is a diagram for explaining a piezoelectric device driving circuit of a fine-motion stage of the known type positioning system.

FIG. 23 is a chart of the third timer interruption sequence T130. At step S1301, the AA detection values are read. At step S1302, the current position data table FIFO-2 is renewed, and the interruption is completed. The remaining portions are of substantially the same structure and function as of those of the first embodiment, and a description therefor is omitted here.

In the first and second embodiments, driving means of the fine-motion stage comprises a piezoelectric device. Clearly, however, the present invention is applicable also to a case where other type of driving means, such as a pulse motor, is used.

While the invention has been described with reference to the structures disclosed herein, it is not confined to the details set forth and this application is intended to cover such modifications or changes as may come within the purposes of the improvements or the scope of the following claims.

What is claimed is:

1. A positioning method, comprising:
   controlling driving means, for moving a movable table on a rough-motion stage by a small amount, alternately through a pair of control systems being able to be switched; and
   adjusting control amounts of the paired control systems to the same amounts, when the paired control systems are switched.

2. A method according to claim 1, wherein, before switching the control systems, the control amount of one of the control systems is applied to the other control system.

3. A method according to claim 2, wherein, after the control systems are switched, the control amount of one of the control systems is changed by regular amounts or at a predetermined ratio to a predetermined value.

4. A method according to claim 1, wherein one of the control systems serves to control the driving means in accordance with a preset command value, and wherein the other control system is adapted to control the driving means on the basis of the difference between a current position of the movable table and a target position which are renewed sequentially.

5. A method according to claim 1, wherein one of the control systems serves to control the driving means in accordance with a detected positional deviation between the movable table and a particular object, and wherein the other control system is adapted to control the driving means on the basis of one of a present command value and the difference between a current position of the movable table and a target position which is renewed sequentially.

6. A method according to claim 1, wherein the driving means comprises a piezoelectric device.

7. A method according to claim 1, wherein the driving means comprises a pulse motor.

8. A positioning system, comprising:
   driving means for moving a movable table on a rough-motion stage by a small amount;
   a pair of control systems being able to be switched and for alternately controlling said driving means; and
   branching means for applying a control amount of one of said pair of control systems to the other of said pair of control systems.

9. A system according to claim 8, wherein one of said pair of control systems serves to control said driving means in accordance with a preset command value, and wherein the other of said pair of control systems is adapted to control said driving means on the basis of a difference between a current position of the movable table and a target position which are renewed sequentially.

10. A system according to claim 8, wherein said driving means includes a piezoelectric device.

11. A system according to claim 8, wherein said driving means includes a pulse motor.

12. An exposure apparatus, comprising:
   a positioning system comprising:
      driving means for moving a movable table on a rough-motion stage by a small amount;
      a pair of control systems being able to be switched and for alternately controlling said driving means;
      branching means for applying a control amount of one of said pair of control systems to the other of said pair of control systems; and
   exposure means for exposing an object positioned by said positioning system.

13. An apparatus according to claim 12, wherein one of said control systems serves to control said driving means in accordance with a present command value, and wherein the other of said control systems is adapted to control said driving means on the basis of a difference between a current position of the movable table and a target position which are renewed sequentially.

14. An apparatus according to claim 12, wherein said driving means includes a piezoelectric device.

15. An apparatus according to claim 12, wherein said driving means includes a pulse motor.

* * * * *

UNITED STATES PATENT AND TRADEMARK OFFICE
CERTIFICATE OF CORRECTION

PATENT NO. : 5,661,388  
DATED : August 26, 1997  
INVENTOR(S) : HIROSHI KUROSAWA Page 1 of 3

It is certified that error appears in the above-identified patent and that said Letters Patent is hereby corrected as shown below:

SHEET 10 OF DRAWINGS

Figure 10, in box 505, "CONVETER" should read --CONVERTER--.

SHEET 11 OF DRAWINGS

Figure 11, in step S113, "CHNGE" should read --CHANGE--.

COLUMN 1

Line 26, "282912/1991" should read --3-282912--.
Line 42, "small" should read --a small--.

COLUMN 2

Line 61, "of" should read --of a--.

COLUMN 3

Line 6, "which" should read --which a--.
Line 7, "means," should read --means--.

COLUMN 8

Line 37, "in the opposite way to the" should read --opposite to the way--.

UNITED STATES PATENT AND TRADEMARK OFFICE
CERTIFICATE OF CORRECTION

PATENT NO. : 5,661,388　　　　Page 2 of 3
DATED : August 26, 1997
INVENTOR(S) : HIROSHI KUROSAWA It is certified that error appears in the above-identified patent and that said Letters Patent is hereby corrected as shown below:

COLUMN 9

Line 5, "theses" should read --these--.
　　　Line 18, "comprises" should read --comprise--.
　　　Line 28, "actuators" should read --actuators,--.

COLUMN 10

Line 31, "diving" should read --driving--.

COLUMN 11

Line 25, "valued" should read --value--.
　　　Line 32, "device" (first occurrence) should be deleted.
　　　Line 44, "Fifth" should read --fifth--.
　　　Line 50, "x" should read --X--.

COLUMN 12

Line 31, "of" should read --of an--.
　　　Line 43, "with in" should read --within--.

COLUMN 13

Line 17, "date" should read --data--.
　　　Line 28, "such" should read --such a--.

UNITED STATES PATENT AND TRADEMARK OFFICE
CERTIFICATE OF CORRECTION

PATENT NO. : 5,661,388  Page 3 of 3
DATED : August 26, 1997
INVENTOR(S) : HIROSHI KUROSAWA It is certified that error appears in the above-identified patent and that said Letters Patent is hereby corrected as shown below:

COLUMN 14

Line 35, "of" should read --of the--.

COLUMN 15

Line 15, "embodiment," should read --embodiment, and an--.
Line 53, "theses" should read --these--.

COLUMN 17

Line 36, "type" should read --types--.
Line 36, "is" should read --are--.

COLUMN 18

Line 11, "present" should read --preset--.

Signed and Sealed this

Fourteenth Day of April, 1998

Attest:

BRUCE LEHMAN

*Attesting Officer*  *Commissioner of Patents and Trademarks*